(12) United States Patent
Zhan et al.

(10) Patent No.: US 11,175,345 B2
(45) Date of Patent: Nov. 16, 2021

(54) SYSTEM AND METHOD FOR DETERMINING AN OPERATIONAL STATUS OF A BATTERY

(71) Applicant: SZ DJI TECHNOLOGY CO., LTD., Shenzhen (CN)

(72) Inventors: Juncheng Zhan, Shenzhen (CN); Lei Wang, Shenzhen (CN); Wentao Wang, Shenzhen (CN); Dayang Zheng, Shenzhen (CN); Hao Luo, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 425 days.

(21) Appl. No.: 15/995,893

(22) Filed: Jun. 1, 2018

(65) Prior Publication Data
US 2018/0275202 A1 Sep. 27, 2018

Related U.S. Application Data

(63) Continuation of application No. PCT/CN2015/096318, filed on Dec. 3, 2015.

(51) Int. Cl.
*G01R 31/392* (2019.01)
*G01R 31/396* (2019.01)
*G01R 31/3842* (2019.01)
*G01R 31/389* (2019.01)
*G01R 31/3835* (2019.01)
*H01M 10/42* (2006.01)

(52) U.S. Cl.
CPC ......... *G01R 31/392* (2019.01); *G01R 31/389* (2019.01); *G01R 31/3835* (2019.01); *G01R 31/3842* (2019.01); *G01R 31/396* (2019.01); *H01M 10/42* (2013.01)

(58) Field of Classification Search
CPC .................................... G01R 31/392
USPC ........................................... 702/63
See application file for complete search history.

(56) References Cited

U.S. PATENT DOCUMENTS

| | | | |
|---|---|---|---|
| 6,369,576 B1* | 4/2002 | Matthews | H01M 10/44 324/426 |
| 7,158,815 B2 | 1/2007 | Roh | |
| 2014/0214346 A1 | 7/2014 | Zhou et al. | |
| 2014/0354213 A1* | 12/2014 | Rivera-Poventud | H02J 7/00712 320/107 |
| 2016/0332533 A1* | 11/2016 | Tistle | B60L 58/25 |
| 2016/0347462 A1* | 12/2016 | Clark | B64D 17/80 |

(Continued)

FOREIGN PATENT DOCUMENTS

| | | |
|---|---|---|
| CN | 101192692 A | 6/2008 |
| CN | 102347517 A | 2/2012 |

(Continued)

OTHER PUBLICATIONS

The World Intellectual Property Organization (WIPO) International Search Report and Written Opinion for PCT/CN2015/096318 dated Aug. 26, 2016 7 Pages.

*Primary Examiner* — Eman A Alkafawi
(74) *Attorney, Agent, or Firm* — Anova Law Group, PLLC

(57) ABSTRACT

A method for detecting an operational status of a battery including a plurality of cells includes obtaining static voltages and dynamic voltages of the cells and determining the operational status of the battery based on the static voltages and dynamic voltages.

18 Claims, 13 Drawing Sheets

(56) References Cited

U.S. PATENT DOCUMENTS

2017/0072803 A1* 3/2017 Murai .................. G01R 31/392
2017/0141369 A1* 5/2017 Burke ................. H01M 2/0275
2017/0276734 A1* 9/2017 Heiries ................ G01R 31/396

FOREIGN PATENT DOCUMENTS

| CN | 102854473 A | 1/2013 |
|---|---|---|
| CN | 202770974 U | 3/2013 |
| CN | 102148522 B | 5/2013 |
| CN | 103513190 A | 1/2014 |
| CN | 104198943 A | 12/2014 |
| CN | 103296733 B | 2/2015 |

* cited by examiner

SYSTEM AND METHOD FOR DETERMINING AN OPERATIONAL STATUS OF A BATTERY

CROSS-REFERENCE TO RELATED APPLICATION

This is a continuation application of International Application No. PCT/CN2015/096318, filed on Dec. 3, 2015, the entire contents of which are incorporated herein by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The disclosed embodiments relate generally to battery diagnostics and more particularly, but not exclusively, to systems and methods for determining an operational status of a battery.

BACKGROUND

Batteries undergo wear and tear through use and can lose effectiveness over time. Battery damage is an especially prevalent problem for batteries used in mobile platforms such as unmanned aerial vehicles (UAV), which typically use soft lithium ion batteries. Such batteries are easily damaged from repeated discharging and recharging and also suffer damage from prolonged exposure to an external environment. The damage to batteries can be manifest in altered electrical characteristics, including altered battery resistance or altered battery capacity.

Conventional methods of battery damage diagnosis often rely on measuring battery resistance or battery capacity. However, such methods rely on measuring a steady state of the battery after charging or discharging and generally cannot be used to diagnose battery damage until several hours after such damage has already occurred. These conventional diagnostic methods hence cannot be used for real-time diagnostics, which are critical for many applications, especially applications involving mobile platforms. For example, UAVs may require real-time assessment of any battery damage in order to maintain safe operations. In such cases, conventional methods of diagnosing battery damage may be inadequate.

In view of the foregoing, there is a need for systems and methods for diagnosing battery damage that overcome the disadvantages of conventional diagnosis methods.

SUMMARY

The present disclosure relates to a system for determining an operational status of a battery and methods for making and using same.

In accordance with a first aspect disclosed herein, there is set forth a method for detecting an operational status of a battery including a plurality of cells, the method including:

obtaining static voltages and dynamic voltages of the cells; and determining the operational status of the battery based on the static voltages and dynamic voltages.

In some embodiments of the disclosed method, the method includes measuring the static voltages and dynamic voltages of the cells.

In some embodiments of the disclosed method, the determining includes determining whether the battery is damaged or is likely to become damaged.

In some embodiments of the disclosed method, the obtaining the static voltages includes obtaining cell voltages when a current drawn from the battery is less than a first current threshold.

In some embodiments of the disclosed method, the first current threshold is from 2 to 10 amperes.

In some embodiments of the disclosed method, the first current threshold is 5 amperes.

In some embodiments of the disclosed method, the obtaining the dynamic voltages includes obtaining cell voltages when a current drawn from the battery is greater than a second current threshold.

In some embodiments of the disclosed method, the second current threshold is the same as the first current threshold.

In some embodiments of the disclosed method, the second current threshold is different from the first current threshold.

In some embodiments of the disclosed method, the second current threshold is from 2 to 10 amperes.

In some embodiments of the disclosed method, the second current threshold is 5 amperes.

In some embodiments of the disclosed method, the determining includes:

measuring a maximum static voltage difference among pairs of cells of the battery;

measuring a maximum dynamic voltage difference among pairs of cells of the battery; and determining whether the battery is damaged or is likely to become damaged based on at least one of the maximum static voltage difference and the maximum dynamic voltage difference.

In some embodiments of the disclosed method, the determining includes determining that the battery is damaged or is likely to become damaged when the maximum static voltage difference is less than a first static voltage threshold, and the maximum dynamic voltage difference is greater than a first dynamic voltage threshold.

In some embodiments of the disclosed method, the first static voltage threshold is from 50 to 100 millivolts In some embodiments of the disclosed method, the first static voltage threshold is 80 millivolts.

In some embodiments of the disclosed method, the first dynamic voltage threshold is 100 to 200 millivolts.

In some embodiments of the disclosed method, the first dynamic voltage threshold is 160 millivolts.

In some embodiments of the disclosed method, the determining includes determining that the battery is damaged or is likely to become damaged when the maximum static voltage difference is between a first static voltage threshold and a second static voltage threshold, and a ratio of the maximum dynamic voltage difference to the maximum static voltage difference is greater than a ratio threshold.

In some embodiments of the disclosed method, the first static voltage threshold is from 50 to 100 millivolts.

In some embodiments of the disclosed method, the first static voltage threshold is 80 millivolts.

In some embodiments of the disclosed method, the second static voltage threshold is from 100 to 200 millivolts.

In some embodiments of the disclosed method, the second static voltage threshold is 150 millivolts.

In some embodiments of the disclosed method, the ratio threshold is from one to five.

In some embodiments of the disclosed method, the ratio threshold is two.

In some embodiments of the disclosed method, the determining includes determining that the battery is damaged or is likely to become damaged when the maximum static voltage difference is greater than a second static voltage threshold.

In some embodiments of the disclosed method, the second static voltage threshold is from 100 to 200 millivolts.

In some embodiments of the disclosed method, the second static voltage threshold is 150 millivolts.

In some embodiments of the disclosed method, the determining includes determining that the battery is damaged or is likely to become damaged when the maximum dynamic voltage difference is greater than a second dynamic voltage threshold.

In some embodiments of the disclosed method, the second dynamic voltage threshold is from 200 to 400 millivolts.

In some embodiments of the disclosed method, the second dynamic voltage threshold is 300 millivolts.

In some embodiments of the disclosed method, the method further includes:

measuring an ambient temperature; and finding that the determining whether the battery is damaged or is likely to become damaged is unreliable when the ambient temperature is less than a temperature threshold.

In some embodiments of the disclosed method, the temperature threshold is 5 degrees Celsius.

In some embodiments of the disclosed method, the method further includes:

determining a maximum voltage of the cells; and finding that the determining whether the battery is damaged or is likely to become damaged is unreliable when the maximum voltage is less than a voltage threshold.

In some embodiments of the disclosed method, the voltage threshold is 3.65 volts.

In some embodiments of the disclosed method, the battery is a battery for providing power to an unmanned aerial vehicle (UAV).

In some embodiments of the disclosed method, the method further includes alerting a ground terminal associated with the UAV upon determining that the battery is damaged or is likely to become damaged.

In some embodiments of the disclosed method, the ground terminal is a remote controller.

In some embodiments of the disclosed method, the ground terminal is a UAV docking station.

In some embodiments of the disclosed method, the method further includes automatically landing the UAV upon determining that the battery is damaged or is likely to become damaged.

In some embodiments of the disclosed method, the method further includes automatically returning the UAV to a point-of-origin upon determining that the battery is damaged or is likely to become damaged.

In accordance with another aspect disclosed herein, there is set forth a system for detecting an operational status of a battery including a plurality of cells, including:

one or more processors individually or collectively configured to:

obtain static voltages and dynamic voltages of the cells; and determine the operational status of the battery based on the static voltages and dynamic voltages.

In some embodiments of the disclosed system, the system further includes one or more detectors configured to measure the static voltages and dynamic voltages of the cells.

In some embodiments of the disclosed system, the processors are configured to determine whether the battery is damaged or is likely to become damaged based on the static voltages and dynamic voltages.

In some embodiments of the disclosed system, the detectors are configured to measure the static voltages by measuring cell voltages when a current drawn from the battery is less than a first current threshold.

In some embodiments of the disclosed system, the first current threshold is from 2 to 10 amperes.

In some embodiments of the disclosed system, the first current threshold is 5 amperes.

In some embodiments of the disclosed system, the detectors are configured to measure the dynamic voltages by measuring cell voltages when a current drawn from the battery is greater than a second current threshold.

In some embodiments of the disclosed system, the second current threshold is from 2 to 10 amperes.

In some embodiments of the disclosed system, the second current threshold is 5 amperes.

In some embodiments of the disclosed system, at least one of the detectors is a voltmeter.

In some embodiments of the disclosed system, at least one of the detectors includes an energy meter chip.

In some embodiments of the disclosed system, the processors are configured to:

measure a maximum static voltage difference among pairs of cells of the battery;

measure a maximum dynamic voltage difference among pairs of cells of the battery; and determine whether the battery is damaged or is likely to become damaged based on at least one of the maximum static voltage difference and the maximum dynamic voltage difference.

In some embodiments of the disclosed system, the processors are configured to determine that the battery is damaged or is likely to become damaged when the maximum static voltage difference is less than a first static voltage threshold, and the maximum dynamic voltage difference is greater than a first dynamic voltage threshold.

In some embodiments of the disclosed system, the first static voltage threshold is from 50 to 100 millivolts In some embodiments of the disclosed system, the first static voltage threshold is 80 millivolts.

In some embodiments of the disclosed system, the first dynamic voltage threshold is 100 to 200 millivolts.

In some embodiments of the disclosed system, the first dynamic voltage threshold is 160 millivolts.

In some embodiments of the disclosed system, the processors are configured to determine that the battery is damaged or is likely to become damaged when the maximum static voltage difference is between a first static voltage threshold and a second static voltage threshold, and a ratio of the maximum dynamic voltage difference to the maximum static voltage difference is greater than a ratio threshold.

In some embodiments of the disclosed system, the first static voltage threshold is from 50 to 100 millivolts.

In some embodiments of the disclosed system, the first static voltage threshold is 80 millivolts.

In some embodiments of the disclosed system, the second static voltage threshold is from 100 to 200 millivolts.

In some embodiments of the disclosed system, the second static voltage threshold is 150 millivolts.

In some embodiments of the disclosed system, the ratio threshold is from one to five.

In some embodiments of the disclosed system, the ratio threshold is two.

In some embodiments of the disclosed system, the processors are configured to determine that the battery is damaged or is likely to become damaged when the maximum static voltage difference is greater than a second static voltage threshold.

In some embodiments of the disclosed system, the second static voltage threshold is from 100 to 200 millivolts.

In some embodiments of the disclosed system, the second static voltage threshold is 150 millivolts.

In some embodiments of the disclosed system, the processors are configured to determine that the battery is damaged or is likely to become damaged when the maximum dynamic voltage difference is greater than a second dynamic voltage threshold.

In some embodiments of the disclosed system, the second dynamic voltage threshold is from 200 to 400 millivolts.

In some embodiments of the disclosed system, the second dynamic voltage threshold is 300 millivolts.

In some embodiments of the disclosed system, the system further includes:

a thermometer configured to measure an ambient temperature, wherein the processors are configured to find that the determination of whether the battery is damaged or is likely to become damaged is unreliable when the ambient temperature is less than a temperature threshold.

In some embodiments of the disclosed system, the temperature threshold is 5 degrees Celsius.

In some embodiments of the disclosed system, the processors are further configured to:

determine a maximum voltage of the cells; and find that the determination of whether the battery is damaged or is likely to become damaged is unreliable when the maximum voltage is less than a voltage threshold.

In some embodiments of the disclosed system, the voltage threshold is 3.65 volts.

In some embodiments of the disclosed system, the battery is a battery of an unmanned aerial vehicle (UAV).

In some embodiments of the disclosed system, the processors are further configured to alert a ground terminal upon determining that the battery is damaged or is likely to become damaged.

In some embodiments of the disclosed system, the ground terminal is a remote controller.

In some embodiments of the disclosed system, the ground terminal is a UAV docking station.

In some embodiments of the disclosed system, the processors are further configured to automatically land the UAV upon determining that the battery is damaged or is likely to become damaged.

In some embodiments of the disclosed system, the processors are further configured to automatically return the UAV to a point-of-origin upon determining that the battery is damaged or is likely to become damaged.

In accordance with another aspect disclosed herein, there is set forth an apparatus including:

a plurality of cells;

one or more detectors configured to measure static voltages and dynamic voltages of the cells; and one or more processors individually or collectively configured to determine an operational status of the battery based on the static voltages and dynamic voltages.

In some embodiments of the disclosed apparatus, the processors are configured to determine whether the battery is damaged based on the static voltages and dynamic voltages.

In some embodiments of the disclosed apparatus, the processors are configured to determine whether the battery is likely to become damaged based on the static voltages and dynamic voltages.

In some embodiments of the disclosed apparatus, the detectors are configured to measure the static voltages by measuring cell voltages when a current drawn from the battery is less than a first current threshold.

In some embodiments of the disclosed apparatus, the first current threshold is from 2 to 10 amperes.

In some embodiments of the disclosed apparatus, the first current threshold is 5 amperes.

In some embodiments of the disclosed apparatus, the detectors are configured to measure the dynamic voltages by measuring cell voltages when a current drawn from the battery is greater than a second current threshold.

In some embodiments of the disclosed apparatus, the second current threshold is from 2 to 10 amperes.

In some embodiments of the disclosed apparatus, the second current threshold is 5 amperes.

In some embodiments of the disclosed apparatus, at least one of the detectors is a voltmeter.

In some embodiments of the disclosed apparatus, at least one of the detectors includes an energy meter chip.

In some embodiments of the disclosed apparatus, the processors are configured to:

measure a maximum static voltage difference among pairs of cells of the battery;

measure a maximum dynamic voltage difference among pairs of cells of the battery; and determine whether the battery is damaged or is likely to become damaged based on at least one of the maximum static voltage difference and the maximum dynamic voltage difference.

In some embodiments of the disclosed apparatus, the processors are configured to determine that the battery is damaged or is likely to become damaged when the maximum static voltage difference is less than a first static voltage threshold, and the maximum dynamic voltage difference is greater than a first dynamic voltage threshold.

In some embodiments of the disclosed apparatus, the first static voltage threshold is from 50 to 100 millivolts In some embodiments of the disclosed apparatus, the first static voltage threshold is 80 millivolts.

In some embodiments of the disclosed apparatus, the first dynamic voltage threshold is 100 to 200 millivolts.

In some embodiments of the disclosed apparatus, the first dynamic voltage threshold is 160 millivolts.

In some embodiments of the disclosed apparatus, the processors are configured to determine that the battery is damaged or is likely to become damaged when the maximum static voltage difference is between a first static voltage threshold and a second static voltage threshold, and a ratio of the maximum dynamic voltage difference to the maximum static voltage difference is greater than a ratio threshold.

In some embodiments of the disclosed apparatus, the first static voltage threshold is from 50 to 100 millivolts.

In some embodiments of the disclosed apparatus, the first static voltage threshold is 80 millivolts.

In some embodiments of the disclosed apparatus, the second static voltage threshold is from 100 to 200 millivolts.

In some embodiments of the disclosed apparatus, the second static voltage threshold is 150 millivolts.

In some embodiments of the disclosed apparatus, the ratio threshold is from one to five.

In some embodiments of the disclosed apparatus, the ratio threshold is two.

In some embodiments of the disclosed apparatus, the processors are configured to determine that the battery is damaged or is likely to become damaged when the maximum static voltage difference is greater than a second static voltage threshold.

In some embodiments of the disclosed apparatus, the second static voltage threshold is from 100 to 200 millivolts.

In some embodiments of the disclosed apparatus, the second static voltage threshold is 150 millivolts.

In some embodiments of the disclosed apparatus, the processors are configured to determine that the battery is damaged or is likely to become damaged when the maximum dynamic voltage difference is greater than a second dynamic voltage threshold.

In some embodiments of the disclosed apparatus, the second dynamic voltage threshold is from 200 to 400 millivolts.

In some embodiments of the disclosed apparatus, the second dynamic voltage threshold is 300 millivolts.

In some embodiments of the disclosed apparatus, the apparatus further includes:

a thermometer configured to measure an ambient temperature, wherein the processors are configured to find that the determination of whether the battery is damaged or is likely to become damaged is unreliable when the ambient temperature is less than a temperature threshold.

In some embodiments of the disclosed apparatus, the temperature threshold is 5 degrees Celsius.

In some embodiments of the disclosed apparatus, the processors are further configured to:

determine a maximum voltage of the cells; and find that the determination of whether the battery is damaged or is likely to become damaged is unreliable when the maximum voltage is less than a voltage threshold.

In some embodiments of the disclosed apparatus, the voltage threshold is 3.65 volts.

In some embodiments of the disclosed apparatus, the battery is a battery of an unmanned aerial vehicle (UAV).

In some embodiments of the disclosed apparatus, the processors are further configured to alert a ground terminal upon determining that the battery is damaged or is likely to become damaged.

In some embodiments of the disclosed apparatus, the ground terminal is a remote controller.

In some embodiments of the disclosed apparatus, the ground terminal is a UAV docking station.

In some embodiments of the disclosed apparatus, the processors are further configured to automatically land the UAV upon determining that the battery is damaged or is likely to become damaged.

In some embodiments of the disclosed apparatus, the processors are further configured to automatically return the UAV to a point-of-origin upon determining that the battery is damaged or is likely to become damaged.

In accordance with another aspect disclosed herein, there is set forth a kit for assembling an apparatus, the kit including:

a plurality of cells;

one or more detectors configured to measure static voltages and dynamic voltages of a plurality of cells; and one or more processors individually or collectively configured to determine an operational status of the cells based on the static voltages and dynamic voltages, wherein the cells are electrically connected to the detectors and the processors when the apparatus is assembled.

In some embodiments of the disclosed kit, the processors are configured to determine whether the battery is damaged based on the static voltages and dynamic voltages.

In some embodiments of the disclosed kit, the processors are configured to determine whether the battery is likely to become damaged based on the static voltages and dynamic voltages.

In some embodiments of the disclosed kit, the detectors are configured to measure the static voltages by measuring cell voltages when a current drawn from the battery is less than a first current threshold.

In some embodiments of the disclosed kit, the first current threshold is from 2 to 10 amperes.

In some embodiments of the disclosed kit, the first current threshold is 5 amperes.

In some embodiments of the disclosed kit, the detectors are configured to measure the dynamic voltages by measuring cell voltages when a current drawn from the battery is greater than a second current threshold.

In some embodiments of the disclosed kit, the second current threshold is from 2 to 10 amperes.

In some embodiments of the disclosed kit, the second current threshold is 5 amperes.

In some embodiments of the disclosed kit, at least one of the detectors is a voltmeter.

In some embodiments of the disclosed kit, at least one of the detectors includes an energy meter chip.

In some embodiments of the disclosed kit, the processors are configured to:

measure a maximum static voltage difference among pairs of cells of the battery;

measure a maximum dynamic voltage difference among pairs of cells of the battery; and determine whether the battery is damaged or is likely to become damaged based on at least one of the maximum static voltage difference and the maximum dynamic voltage difference.

In some embodiments of the disclosed kit, the processors are configured to determine that the battery is damaged or is likely to become damaged when the maximum static voltage difference is less than a first static voltage threshold, and the maximum dynamic voltage difference is greater than a first dynamic voltage threshold.

In some embodiments of the disclosed kit, the first static voltage threshold is from 50 to 100 millivolts.

In some embodiments of the disclosed kit, the first static voltage threshold is 80 millivolts.

In some embodiments of the disclosed kit, the first dynamic voltage threshold is 100 to 200 millivolts.

In some embodiments of the disclosed kit, the first dynamic voltage threshold is 160 millivolts.

In some embodiments of the disclosed kit, the processors are configured to determine that the battery is damaged or is likely to become damaged when the maximum static voltage difference is between a first static voltage threshold and a second static voltage threshold, and a ratio of the maximum dynamic voltage difference to the maximum static voltage difference is greater than a ratio threshold.

In some embodiments of the disclosed kit, the first static voltage threshold is from 50 to 100 millivolts.

In some embodiments of the disclosed kit, the first static voltage threshold is 80 millivolts.

In some embodiments of the disclosed kit, the second static voltage threshold is from 100 to 200 millivolts.

In some embodiments of the disclosed kit, the second static voltage threshold is 150 millivolts.

In some embodiments of the disclosed kit, the ratio threshold is from one to five.

In some embodiments of the disclosed kit, the ratio threshold is two.

In some embodiments of the disclosed kit, the processors are configured to determine that the battery is damaged or is likely to become damaged when the maximum static voltage difference is greater than a second static voltage threshold.

In some embodiments of the disclosed kit, the second static voltage threshold is from 100 to 200 millivolts.

In some embodiments of the disclosed kit, the second static voltage threshold is 150 millivolts.

In some embodiments of the disclosed kit, the processors are configured to determine that the battery is damaged or is likely to become damaged when the maximum dynamic voltage difference is greater than a second dynamic voltage threshold.

In some embodiments of the disclosed kit, the second dynamic voltage threshold is from 200 to 400 millivolts.

In some embodiments of the disclosed kit, the second dynamic voltage threshold is 300 millivolts.

In some embodiments of the disclosed kit, the kit further includes:

a thermometer configured to measure an ambient temperature, wherein the processors are configured to find that the determination of whether the battery is damaged or is likely to become damaged is unreliable when the ambient temperature is less than a temperature threshold.

In some embodiments of the disclosed kit, the temperature threshold is 5 degrees Celsius.

In some embodiments of the disclosed kit, the processors are further configured to:

determine a maximum voltage of the cells; and find that the determination of whether the battery is damaged or is likely to become damaged is unreliable when the maximum voltage is less than a voltage threshold.

In some embodiments of the disclosed kit, the voltage threshold is 3.65 volts.

In some embodiments of the disclosed kit, the battery is a battery of an unmanned aerial vehicle (UAV).

In some embodiments of the disclosed kit, the processors are further configured to alert a ground terminal upon determining that the battery is damaged or is likely to become damaged.

In some embodiments of the disclosed kit, the ground terminal is a remote controller.

In some embodiments of the disclosed kit, the ground terminal is a UAV docking station.

In some embodiments of the disclosed kit, the processors are further configured to automatically land the UAV upon determining that the battery is damaged or is likely to become damaged.

In some embodiments of the disclosed kit, the processors are further configured to automatically return the UAV to a point-of-origin upon determining that the battery is damaged or is likely to become damaged.

Figure 1:
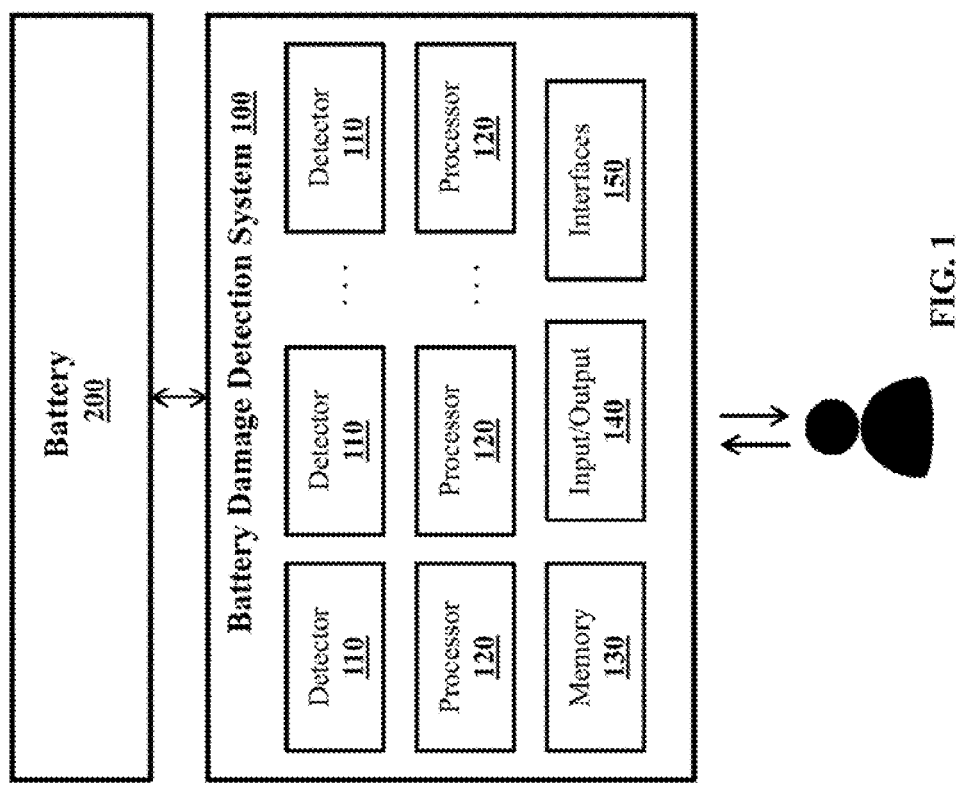
FIG. 1 is an exemplary top-level diagram illustrating an embodiment of a battery diagnostic system.

It should be noted that the figures are not drawn to scale and that elements of similar structures or functions are generally represented by like reference numerals for illustrative purposes throughout the figures. It also should be noted that the figures are only intended to facilitate the description of the illustrative embodiments. The figures do not illustrate every aspect of the described embodiments and do not limit the scope of the present disclosure.

DETAILED DESCRIPTION OF THE EMBODIMENTS

The present disclosure sets forth systems and methods for using voltages—in particular, static and dynamic voltages— of a plurality of cells of a battery to determine an operational status of the battery. For example, the present systems and method allow for determining whether the battery is damaged and/or is likely to become damaged. The present systems and method allow for rapid and/or real-time battery damage diagnoses that are suitable for mobile platforms such as UAVs, thus overcoming disadvantages of conventional systems and methods.

Turning now to FIG. 1, an exemplary battery diagnostic system 100 is shown as interfacing with a battery 200. The battery diagnostic system 100 can include one or more detectors 110 for detecting one or more electrical characteristics of the battery 200. Exemplary electrical characteristics of the battery 220 can include a voltage, capacity, resistance, conductance, impedance, inductance, capacitance, electric field and/or magnetic field. Exemplary detectors 110 include, but are not limited to, voltmeters, ammeters, energy meter chips, and the like, for measuring the electrical characteristics of the battery 200. The battery diagnostic system 100 can include any number of detectors 110, as desired—for example, 1, 2, 3, 4, 5, 6, or even a greater number of detectors 110. The detectors 110 can be arranged in any desired configuration in the battery diagnostic system 100. The arrangement of the detectors 110, for example, can be based on configuration of the battery 200, and, more particularly, on the number and configuration of cells 210 (shown in FIG. 2) of the battery 200. In some embodiments, the number of detectors 110 of the battery diagnostic system 100 can be configured to match the number of cells 210 of a corresponding battery 200.

As shown in FIG. 1, the battery diagnostic system 100 can include one or more processors 120. Without limitation, each processor 120 can include one or more general purpose microprocessors (for example, single or multi-core processors), application-specific integrated circuits (ASIC), field-programmable gate arrays (FPGA), application-specific instruction-set processors, digital signal processing units, coprocessors, network processing units, audio processing units, encryption processing units, and the like. The processors 120 can be individually and/or collectively configured to perform any of the methods described herein, including but not limited to a variety of operations relating to battery damage diagnostics. In some embodiments, the processors 120 can include specialized hardware for processing specific operations relating to battery damage diagnostics—for example, measuring static and dynamic voltages of battery cells, and determining whether a battery 200 is damaged or is likely to become damaged based on such voltages.

In some embodiments, the processors 120 can be located in physical proximity to the detectors 110. The processors 120 and the detectors 110 can be configured to communicate locally, for example, using hardware connectors and buses. One or more of the detectors 110 and/or processors 120 can be at least partially integrated and included as part of an apparatus (not shown) for diagnosing battery damage. For example, the apparatus can include the battery 200 as a component of the apparatus. In other embodiments, one or more of the detectors 110 and/or processors 120 can be included as part of physically separate modules (not shown) of the battery diagnostic system 100. Where the detectors 110 and the processors 120 are physically separate, a wireless communication protocol can be used for remote communications between the detectors 110 and the processors 120. Suitable wireless communication methods include, for example, radio, Wireless Fidelity (Wi-Fi), cellular, satellite, and broadcasting.

In some embodiments, the cells 210, the detectors 110, and/or the processors 120 described herein can be components of a kit (not shown) for assembling an apparatus that can detect damage or potential damage to a battery 200. The processors 120 can be placed in communication, either directly or remotely as described above, with the detectors 110 when the apparatus is assembled. Alternatively, and/or additionally, the cells 210 can be electrically connected to the detectors 110 and/or the processors 120 when the apparatus is assembled.

As shown in FIG. 1, the battery diagnostic system 100 can include an optional memory 130. Suitable memories 130 can include, for example, random access memory (RAM), static RAM, dynamic RAM, read-only memory (ROM), programmable ROM, erasable programmable ROM, electrically erasable programmable ROM, flash memory, secure digital (SD) card, and the like. The memory 130 can be used to store, for example, voltage measurements of battery cells 210, as well as various thresholds values (discussed in further detail with reference to FIGS. 4-10 below) and/or other system data for determining whether the battery 200 is damaged or is likely to become damaged. For example, the memory 130 can also be used to store code for execution by the processors 120, as well as electrical characteristics of the battery 200 or the cells 210.

FIG. 1 shows that the battery diagnostic system 100 can include one or more optional input/output devices 140, for example, buttons, a keyboard, keypad, trackball, displays, and/or a monitor. The input/output devices can be used to operate a suitable interface with a user for performing battery damage diagnostics. For example, the input/output devices 140 can be used to modify diagnostic settings (for example, thresholds), display one or more electrical characteristics (for example, voltage, resistance, current, and the like) of the battery 200, and/or indicate to the user whether the battery 200 is damaged or is likely to become damaged. The battery diagnostic system 100 or components thereof can further include one or more data interfaces 150 for communication with other components of the battery diagnostic system 100 as well as with external components. Suitable data interfaces include, for example, universal serial bus (USB), digital visual interface (DVI), display port, serial ATA (SATA), IEEE 1394 interface (also known as FireWire), serial, video graphics array (VGA), super video graphics array (SVGA), small computer system interface (SCSI), high-definition multimedia interface (HDMI), audio ports, and/or proprietary interfaces. The battery diagnostic system 100 can include one or more additional hardware components (not shown), as desired.

Figure 2:
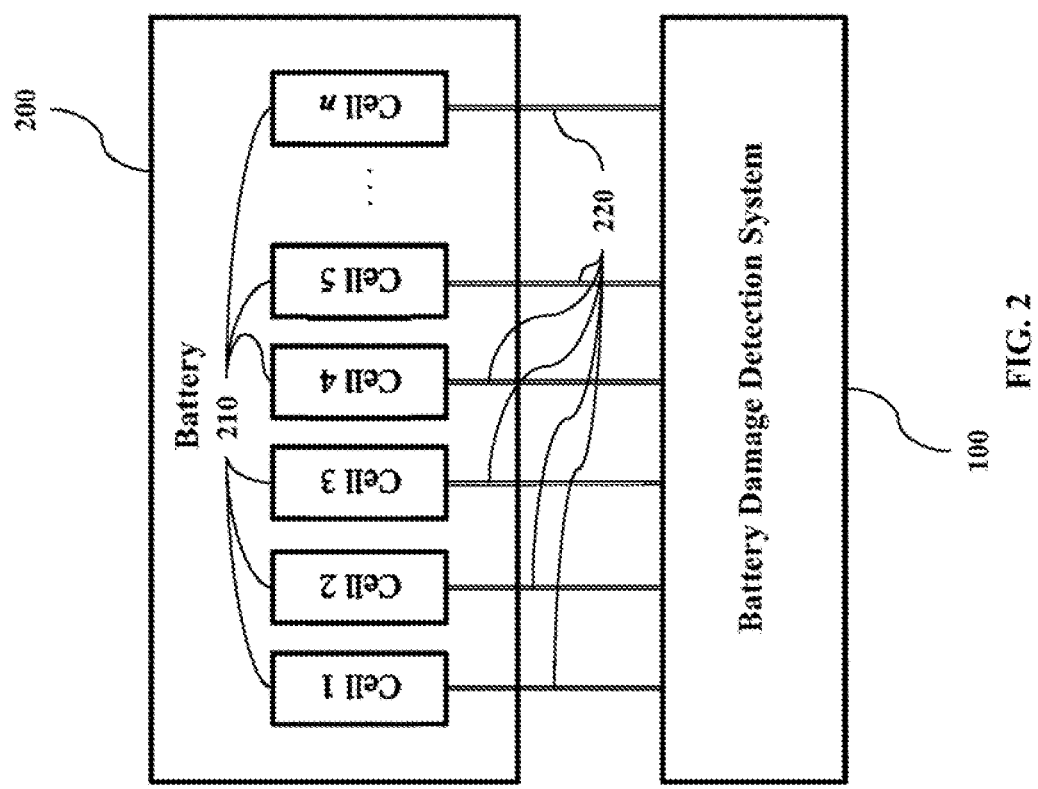
FIG. 2 is an exemplary top-level diagram illustrating an alternative embodiment of the battery diagnostic system of FIG. 1, wherein the battery diagnostic system interfaces with a battery including a plurality of cells.

Turning now to FIG. 2, an exemplary battery 200 is shown as including a plurality of cells 210. The battery 200 can provide electrical power to an apparatus or other load (not shown) that is connected to the battery 200. The battery 200 can include any number of cells 210. Each of the cells 210 can include, for examples, two electrodes (not shown) and an electrolyte (not shown) that reacts chemically to generate an electric potential, providing electric current between the electrodes. The cells 210 can be chargeable and/or rechargeable. The cells 210 can be any type of battery cells, including, but not limited to, lead-acid cells, lithium air cells, lithium-ion cells, nickel-cadmium cells, nickel-metal hydride hydrogen cells and the like. The cells 210 can be connected to each other within the battery 200 by one or more series and/or parallel connections.

For purposes of diagnosing damage or potential damage to the battery 200, the cells 210 can be individually and/or collectively electrically connected to the battery diagnostic system 100. For example, each of the cells 210 can be electrically connected to the battery diagnostic system 100 using a respective connector 220. The connector 220 can be directly wired from a selected cell 210 to a detector 110 of the battery diagnostic system 100. In some embodiments, each cell 210 can be wired via the connector 220 to a separate detector 110 that is dedicated to detecting an operational status of that cell 210. For example, the connector 220 can include two separate probes that are placed into electrical contact with the anode and cathode (not shown) of the selected cell 210, respectively, in order to measure a voltage across the cell 210. Alternatively and/or additionally, multiple cells 210 can be connected to a single detector 110. In some embodiments, the connectors 220 can be connected to other portions of the battery circuitry (for example, internal electrical conductors) that allow reading of the relevant electrical characteristics of the cells 210 for diagnosing battery damage. In some embodiments, a connector 220 can be sequentially connected to a plurality of selected cells 210 to sequentially read the relevant electrical characteristics of the selected cells 210 to detect an operational status of the battery 200.

Figure 3:
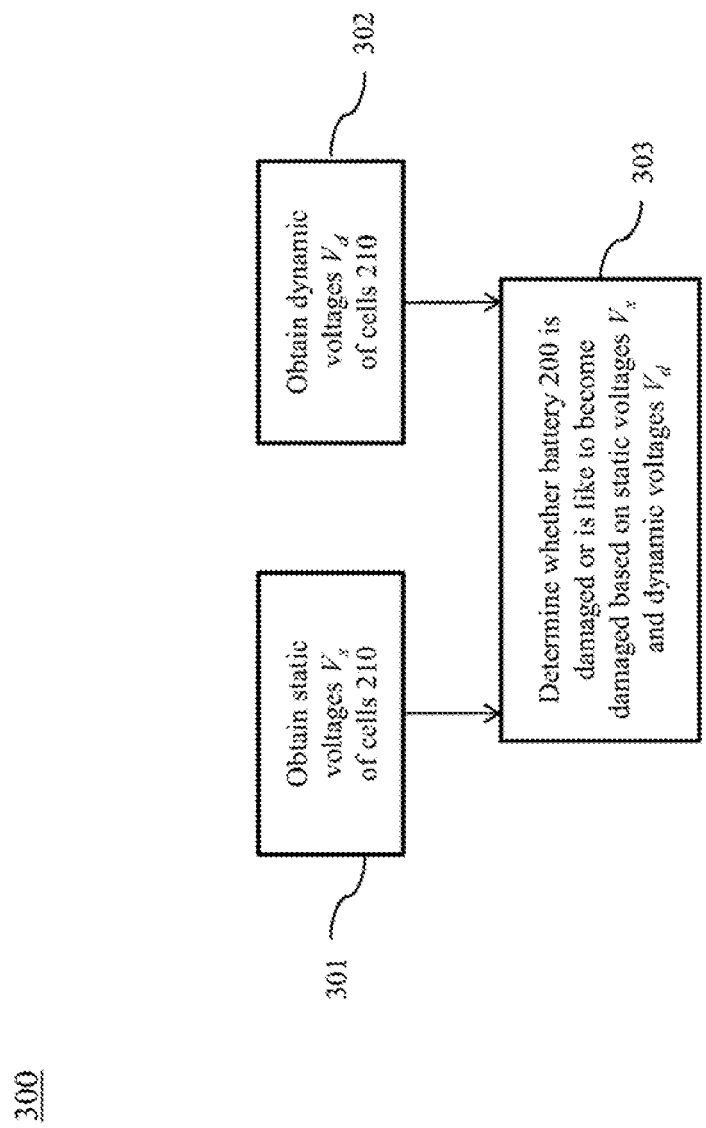
FIG. 3 is an exemplary top level flow chart illustrating an embodiment of a method for detecting an operational status of a battery using the battery diagnostic system of FIG. 1.

Turning now to FIG. 3, an exemplary method 300 for detecting an operational status of a battery 200 (shown in FIG. 2) is shown. In some embodiments, the method can be used to determine whether the battery 200 is damaged or likely to become damaged. At 301, a static voltage $V_s$ is obtained for each of the cells 210 (shown in FIG. 2) of the battery 200. In some embodiments, only a subset of the cells 210 are measured, while remaining cells 210 are not measured. The static voltage $V_s$ is a measurement of an electric potential difference across the cell 210 when the current drawn from the battery 200 is less than a first current threshold $I_s$. Stated somewhat differently, when the current drawn from the battery 200 is below the first current threshold $I_s$, the battery 200 can be deemed at or close to state of inactivity, and the voltage in this inactive state is deemed to be the static voltage $V_s$.

For purposes of measuring a static voltage $V_s$, the first current threshold $I_s$ can be a predetermined value provided by the battery diagnostic system 100. The predetermined value of the first current threshold $I_s$ can vary based on the battery 200, the specific configuration of cells 210, and/or on the electrical load on the battery 200. In some embodiments, the first current threshold $I_s$ can be set at about 10 to 20 milliamperes, 50 to 100 milliamperes, 100 to 200 milliamperes, 200 to 500 milliamperes, 500 milliamperes to 1 ampere, 1 to 2 amperes, 2 to 10 amperes, 3 to 7 amperes, 10 to 20 amperes, 20 to 50 amperes, 50 to 100 amperes, or even higher. In some embodiments where the battery 200 is connected to a mobile platform, such as an unmanned aerial vehicle (UAV) (shown in FIG. 12), the first current threshold $I_s$ can be about 5 amperes. The specific time for measuring a static voltage $V_s$ can depend on the particular application or apparatus to be powered by the battery 200 and can generally correspond to a quiescent state of that application or apparatus. For example, measuring the static voltage $V_s$ for a UAV can generally be performed during low power-consumption stages of operation (for example, prior to takeoff or during cruising periods).

At 302, a dynamic voltage $V_d$ is obtained for each of the cells 210 of the battery 200. In some embodiments, a subset of the cells 210 are measured, while other cells 210 are not measured. The dynamic voltage $V_d$ is a measurement of an electrical potential difference across the cell 210 when the current drawn from the battery 200 is greater than a second current threshold $I_d$. Stated somewhat differently, when the current drawn from the battery 200 is greater than the second current threshold $I_d$, the battery 200 can be deemed at or close to an active state, and the voltage in this active state is deemed to be the dynamic voltage $V_d$.

For purposes of measuring a dynamic voltage $V_d$, the second current threshold $I_d$ can be predetermined in the battery diagnostic system 100. The predetermined value of the second current threshold $I_d$ can vary based on the battery 200 and the specific configuration of cells 210, as well as on the electrical load on the battery 200. In some embodiments, the second current threshold $I_d$ can be set at about 10 to 20 milliamperes, 50 to 100 milliamperes, 100 to 200 milliamperes, 200 to 500 milliamperes, 500 milliamperes to 1 ampere, 1 to 2 amperes, 2 to 10 amperes, 3 to 7 amperes, 10 to 20 amperes, 20 to 50 amperes, 50 to 100 amperes, or even higher. In some embodiments, the second current threshold $I_d$ can be the same as the first current threshold $I_s$. In other embodiments, the second current threshold $I_d$ can be different from the first current threshold $I_s$. In some embodiments where the battery 200 is connected to a mobile platform such as UAV, the second current threshold $I_d$ can be about 5 amperes. The specific time for measuring a dynamic voltage $V_d$ can depend on the particular application or apparatus that the battery 200 powers, and can generally correspond to an active state of that application or apparatus. For example, measuring the dynamic voltage $V_d$ for a UAV can generally be performed during high power-consumption stages of operation (for example, while ascending during flight).

The first current threshold $I_s$ and the second current threshold $I_d$ can each be predetermined by a user. Alternatively and/or additionally, the first current threshold $I_s$ and the second current threshold $I_d$ can each can be predetermined automatically by the battery diagnostic system 100 based on the type of battery 200, the load, and/or the application. For example, the battery diagnostic system 100 can have a number of predetermined threshold configurations corresponding to particular batteries 200, and automatically load an appropriate configuration upon detection of the particular battery 200.

At 303, the operational status of the battery 200—for example, whether the battery 200 is damaged or is likely to become damaged—can be determined based on the measured static voltages $V_s$ and/or the measured dynamic voltages $V_d$ of the cells 210. In some embodiments, a diagnosis can be made based on the static voltages $V_s$ and/or the dynamic voltages $V_d$ being greater than and/or less than respective predetermined thresholds. In other embodiments, a diagnosis can be made based on a ratio of the static voltages $V_s$ to the dynamic voltages $V_d$ being greater than and/or less than respective predetermined thresholds. In other embodiments, a diagnosis can be made based on finding a maximum voltage difference $\Delta V$ between any two cells 210 of the battery 200. Particular embodiments for making a diagnosis based on the measured static voltages $V_s$ and the measured dynamic voltages $V_d$ are described with more particularity below with reference to FIGS. 4-9.

Figure 4:
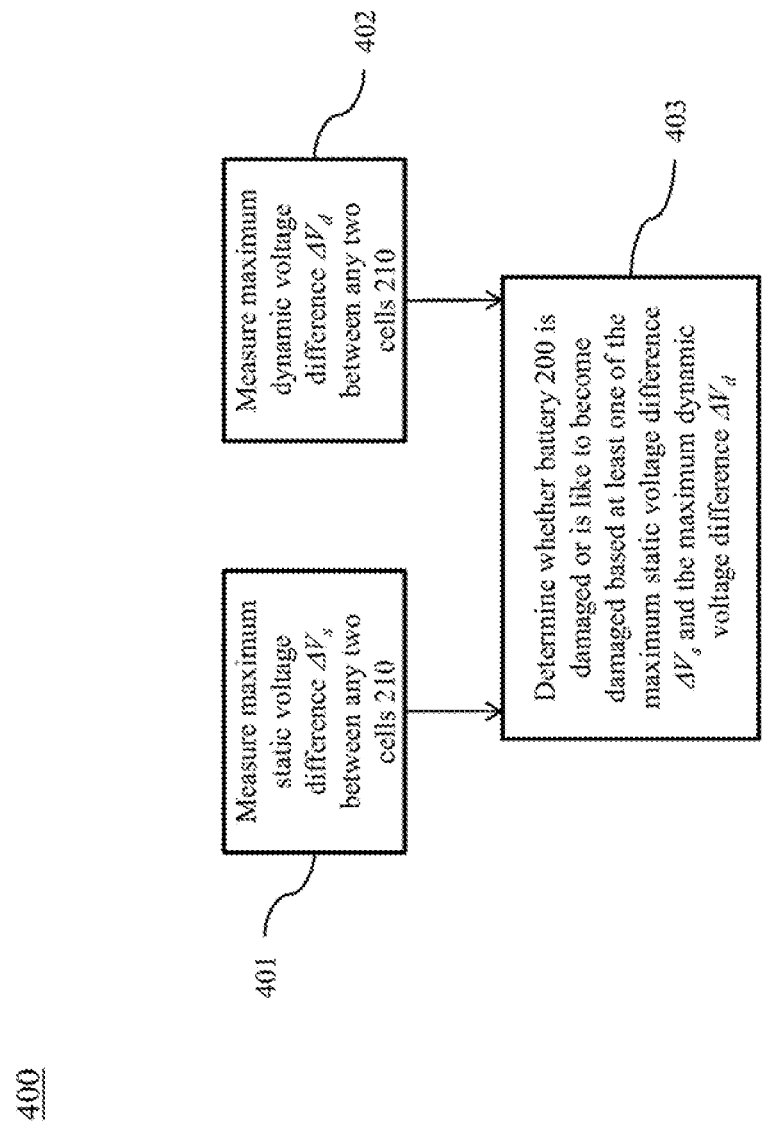
FIG. 4 is an exemplary flow chart an alternative embodiment of the method of FIG. 3, wherein maximum static and dynamic voltages differences between battery cells are measured for detecting the operational status of the battery.

Turning now to FIG. 4, an exemplary method 400 is shown for determining whether a battery 200 is damaged or likely to become damaged based on maximum voltage differences $\Delta V$ between cells 210 of the battery 200. At 401, a maximum static voltage difference $\Delta V_s$ between any two cells 210 of the battery 200 is determined. More particularly, the maximum static voltage difference $\Delta V_s$ can be obtained by taking the set of all or some of the static voltages $V_s$ measured for the cells 210 and finding a difference between all pairs of these static voltages $V_s$. The maximum difference found between the pairs of the static voltages $V_s$ can then be deemed to be the maximum static voltage difference $\Delta V_s$. As a non-limiting example, if the static voltages $V_s$ are measured as 1.9 volts, 2.1 volts, 2.2 volts, and 2.3 volts, then the maximum static voltage difference $\Delta V_s$ is 0.4 volts or 400 millivolts, based on the difference between 1.9 volts and 2.3 volts.

At 402, a similar step is performed to determine a maximum dynamic voltage difference $\Delta V_d$ between any two cells 210 of the battery 200. More particularly, the maximum dynamic voltage difference $\Delta V_d$ can be obtained by taking the set of all or some of the dynamic voltages $V_d$ measured for the cells 210, and finding a difference between all pairs of these dynamic voltages $V_d$. The maximum difference found between the pairs of the dynamic voltages $V_d$ can then be deemed to be the maximum dynamic voltage difference $\Delta V_d$. Similar to the above non-limiting example, if the dynamic voltages $V_d$ are measured as 1.95 volts, 1.98 volts, 2.05 volts, and 2.25 volts, then the maximum dynamic voltage difference $\Delta V_d$ is 0.30 volts or 300 millivolts, based on the difference between 1.95 volts and 2.25 volts.

At 403, whether the battery 200 is damaged or likely to become damaged is determined based on the maximum static voltage difference $\Delta V_s$ and the maximum dynamic voltage difference $\Delta V_d$. In some embodiments, a damage diagnosis can be made based on the maximum static voltage difference $\Delta V_s$ and/or the maximum dynamic voltage difference $\Delta V_d$ being greater than and/or less than respective predetermined thresholds. In other embodiments, a damage diagnosis can be made based on a ratio of the maximum static voltage difference $\Delta V_s$ to the maximum dynamic voltage difference $\Delta V_d$ being greater than and/or less than respective predetermined thresholds. Particular embodiments for making a damage diagnosis based on the measured maximum static voltage difference $\Delta V_s$ and/or the maximum dynamic voltage difference $\Delta V_d$ are described with more particularity below with reference to FIGS. 5-9.

Figure 5:
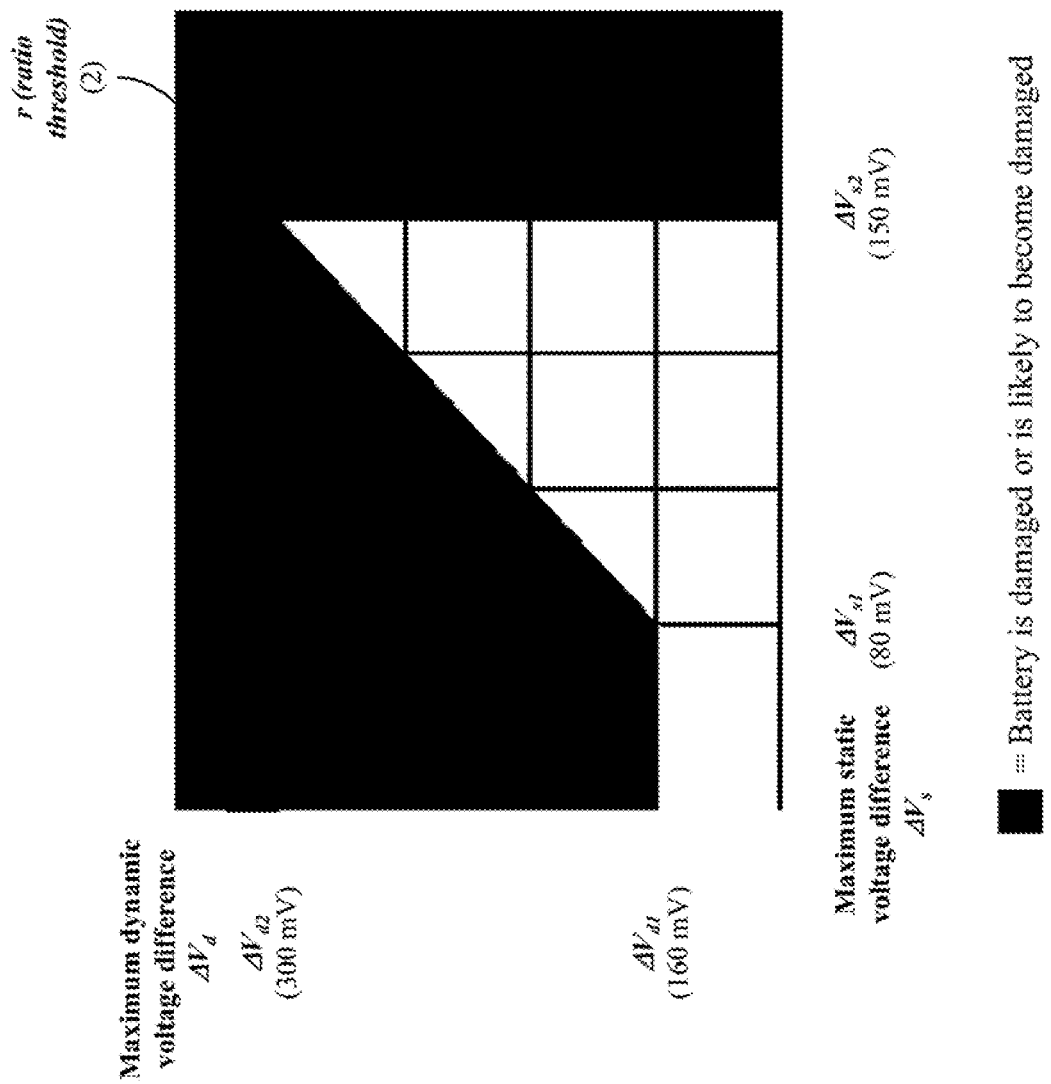
FIG. 5 is an exemplary diagram illustrating conditions under which a battery can be deemed to be damaged or likely to become damaged based on maximum static and dynamic voltages differences.

Turning now to FIG. 5, an exemplary diagram is shown as depicting a plot of the maximum static voltage difference $\Delta V_s$ on the horizontal axis and the maximum dynamic voltage difference $\Delta V_d$ on the vertical axis. Shaded regions of the plot correspond to exemplary values of the maximum static voltage difference $\Delta V_s$ and the maximum dynamic voltage difference $\Delta V_d$ at which a battery 200 can be determined to be damaged or likely to become damaged.

In the example depicted in FIG. 5, where the maximum static voltage difference $\Delta V_s$ is less than a first static voltage threshold $\Delta V_{s1}$ (for example, 80 millivolts as shown), the battery 200 can be determined to be damaged or likely to become damaged if the maximum dynamic voltage difference $\Delta V_d$ is greater than a first dynamic voltage threshold $\Delta V_{d1}$ (for example, 160 millivolts as shown).

In a regime where the maximum static voltage difference $\Delta V_s$ is between the first static voltage threshold $\Delta V_{s1}$ and a second static voltage threshold $\Delta V_{s2}$ (for example, 150 millivolts as shown), battery 200 can be determined to be damaged or likely to become damaged if a ratio between the maximum dynamic voltage difference $\Delta V_d$ and maximum static voltage difference $\Delta V_s$ is greater than a certain ratio threshold r (here shown as a ratio threshold of r=2). As depicted in FIG. 5, the slope of the boundary between the shaded and unshaded regions between a maximum static voltage difference $\Delta V_s$ of 80 and 150 millivolts (mV) corresponds to the ratio threshold r. Here, the value of the ratio threshold r is 2, since (300 mV−160 mV)/(150 mV−80 mV) equals 2.

In a regime where the maximum static voltage difference $\Delta V_s$ is greater than the second static voltage threshold $\Delta V_{s2}$, the battery 200 can be determined to be damaged or likely to become damaged irrespective of the maximum dynamic voltage difference $\Delta V_d$. Similarly, in a regime where, the maximum dynamic voltage difference $\Delta V_d$ is greater than a second dynamic voltage threshold $\Delta V_{d2}$ (for example, 300 millivolts as shown), the battery 200 can be determined to be damaged or likely to become damaged irrespective of the maximum static voltage difference $\Delta V_s$.

The threshold parameters for battery damage diagnosis described herein, namely $\Delta V_{s1}$, $\Delta V_{s2}$, $\Delta V_{d1}$, $\Delta V_{d2}$, and r, can depend on the particular battery 200, the configuration of cells 210 in the battery, the load across the battery 200, and the application or apparatus that consumes the power supplied by the battery 200. The voltage thresholds $\Delta V_{s1}$, $\Delta V_{s2}$, $\Delta V_{d1}$, $\Delta V_{d2}$ can each take on any appropriate value and/or range of values, for example, 10 to 20 millivolts, 20 to 50 millivolts, 50 to 80 millivolts, 50 to 100 millivolts, 80 to 100 millivolts, 100 to 150 millivolts, 100 to 200 millivolts, 150 to 200 millivolts, 200 to 300 millivolts, 200 to 400 millivolts, 300 to 500 millivolts, 500 millivolts to 1 volt, 1 to 2 volts, 2 to 5 volts, or more. The ratio threshold r can take on any appropriate value and/or range of values, for example, 0.01 to 0.05, 0.05 to 0.1, 0.1 to 0.2, 0.2 to 0.5, 0.5 to 1, 1 to 2, 2 to 5, 1 to 10, 5 to 10, 10 to 20, 20 to 50, 50 to 100, or an even greater value or range of values.

Similarly to the current thresholds $I_s$ and $I_d$, the threshold parameters $\Delta V_s$, $\Delta V_{s2}$, $\Delta V_{d1}$, $\Delta V_{d2}$, and r can each be predetermined by a user. Alternatively and/or additionally, one or more parameters can be predetermined automatically by the battery diagnostic system 100 based on, for example, the type of battery 200, the battery load, and/or the application/apparatus. In some embodiments, some threshold parameters can be predetermined by the user, while other threshold parameters can be automatically predetermined by the battery diagnostic system 100. For example, the battery diagnostic system 100 can have a number of predetermined threshold configurations with a set of testing parameters $\Delta V_{s1}$, $\Delta V_{s2}$, $\Delta V_{d1}$, $\Delta V_{d2}$, r, $I_s$ and $I_d$ corresponding to particular batteries 200, and automatically load an appropriate configuration upon detection of the particular battery 200.

Figure 6:
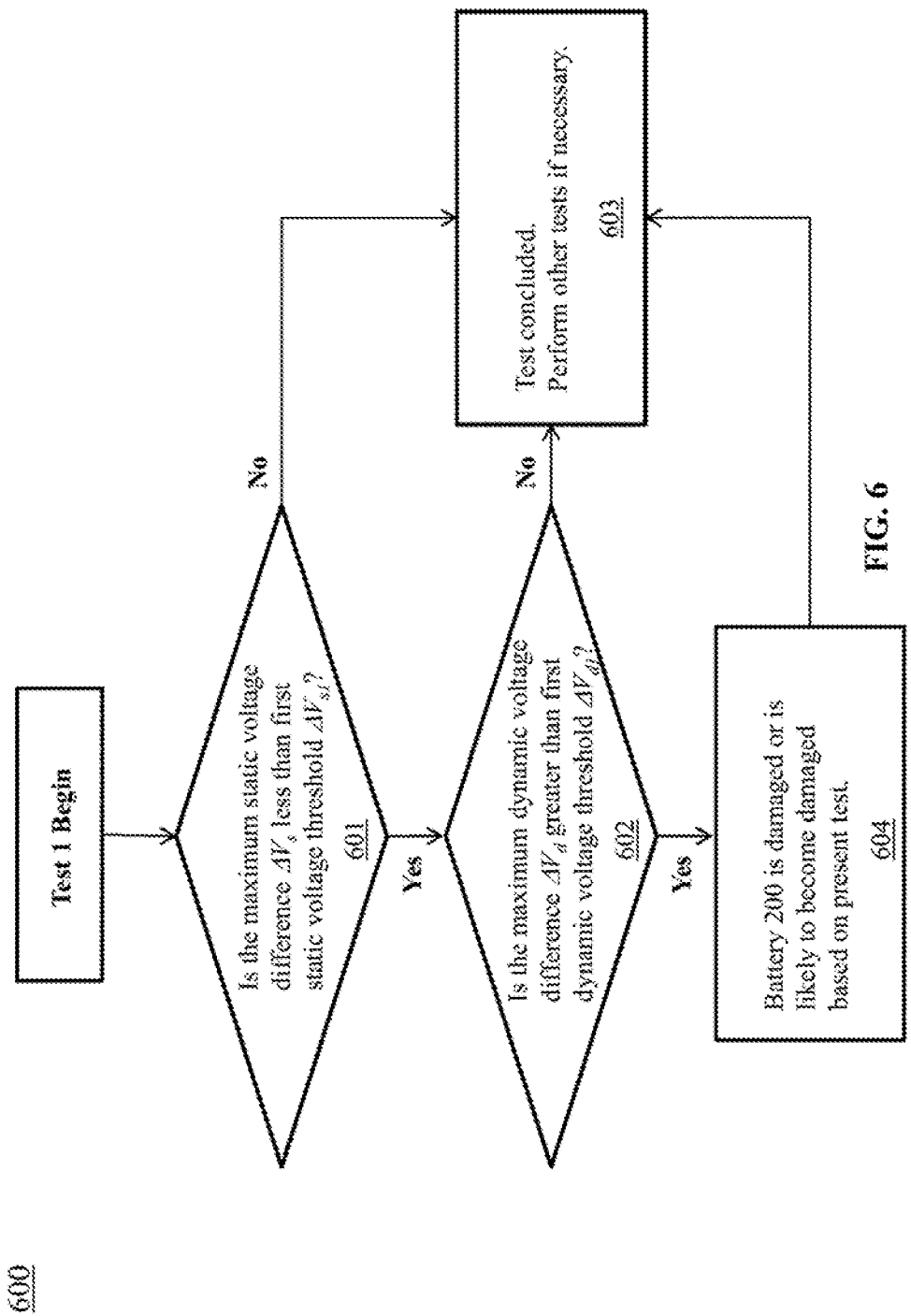
FIG. 6 is an exemplary decision flow chart illustrating an alternative embodiment of the method of FIG. 4, wherein whether a battery is or is likely to become damaged is determined based on maximum static and dynamic voltages differences.

Turning now to FIG. 6, an exemplary decision flow chart 600 (labeled as "Test 1") is shown for determining whether a battery 200 is damaged or is likely to become damaged based on a maximum static voltage difference $\Delta V_s$ and a maximum dynamic voltage difference $\Delta V_d$. At 601, whether the maximum static voltage difference $\Delta V_s$ is less than a first static voltage threshold $\Delta V_{s1}$ is determined. If the maximum static voltage difference $\Delta V_s$ is not less than the first static voltage threshold $\Delta V_{s1}$, then the present test is concluded, at 603, and other optional tests can be performed if necessary. If the maximum static voltage difference $\Delta V_s$ is less than the first static voltage threshold $\Delta V_{s1}$, then whether the maximum dynamic voltage difference $\Delta V_d$ is greater than a first dynamic voltage threshold $\Delta V_{d1}$ is determined, at 602. If the maximum dynamic voltage difference $\Delta V_d$ is not greater than the first dynamic voltage threshold $\Delta V_{d1}$, then the present test is concluded, at 603, and the other tests can be performed if necessary. If the maximum dynamic voltage difference $\Delta V_d$ is greater than the first dynamic voltage threshold $\Delta V_{d1}$, then the present test is concluded at 604, and the battery 200 is determined to be damaged or likely to become damaged based on the present test.

Figure 7:
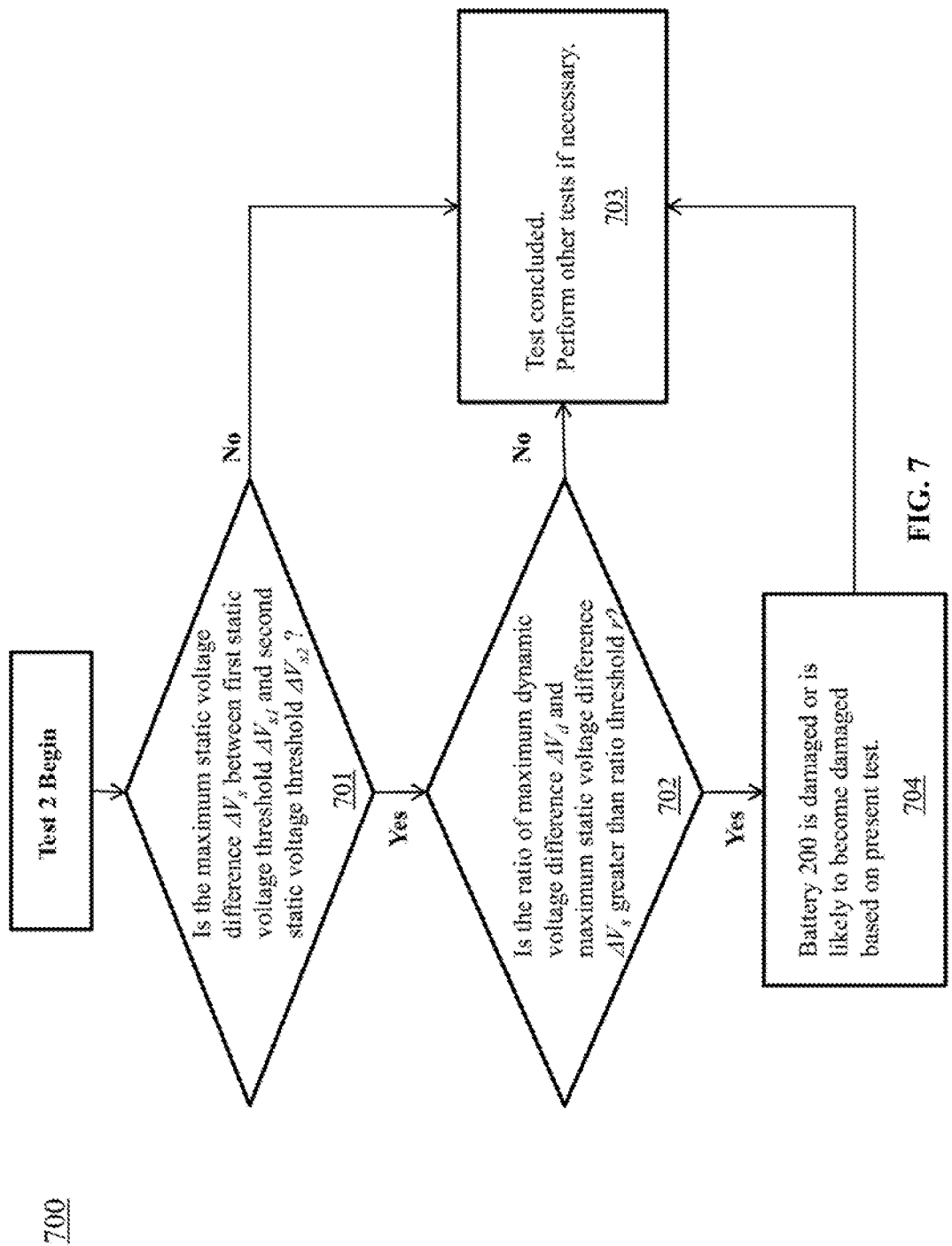
FIG. 7 is an exemplary decision flow chart illustrating another alternative embodiment of the method of FIG. 4, wherein whether a battery is or is likely to become damaged is determined based on a maximum static voltages difference being between two thresholds and a ratio of the maximum static and dynamic voltages differences being greater than a threshold.

Turning now to FIG. 7, another exemplary decision flow chart 700 (labeled as "Test 2") is shown for determining whether a battery 200 is damaged or is likely to become damaged based on a maximum static voltage difference $\Delta V_s$ and a maximum dynamic voltage difference $\Delta V_d$. At 701, whether the maximum static voltage difference $\Delta V_s$ is between a first static voltage threshold $\Delta V_{s1}$ and a second static voltage threshold $\Delta V_{s2}$ is determined. If the maximum static voltage difference $\Delta V_s$ is not between the first static voltage threshold $\Delta V_{s1}$ and the second static voltage threshold $\Delta V_{s2}$, then the present test is concluded, at 703, and other optional tests can be performed if necessary. If the maximum static voltage difference $\Delta V_s$ is between the first static voltage threshold $\Delta V_{s1}$ and the second static voltage threshold $\Delta V_{s2}$, then whether a ratio of the maximum dynamic voltage difference $\Delta V_d$ to the maximum static voltage difference $\Delta V_s$ is greater than a ratio threshold r is determined at 702. If this ratio is not greater than the ratio threshold r, then the present test is concluded at 703, and the other tests can be performed if necessary. If the ratio is greater than the ratio threshold r, then the present test is concluded at 704, and the battery 200 is determined to be damaged or likely to become damaged based on the present test.

Figure 8:
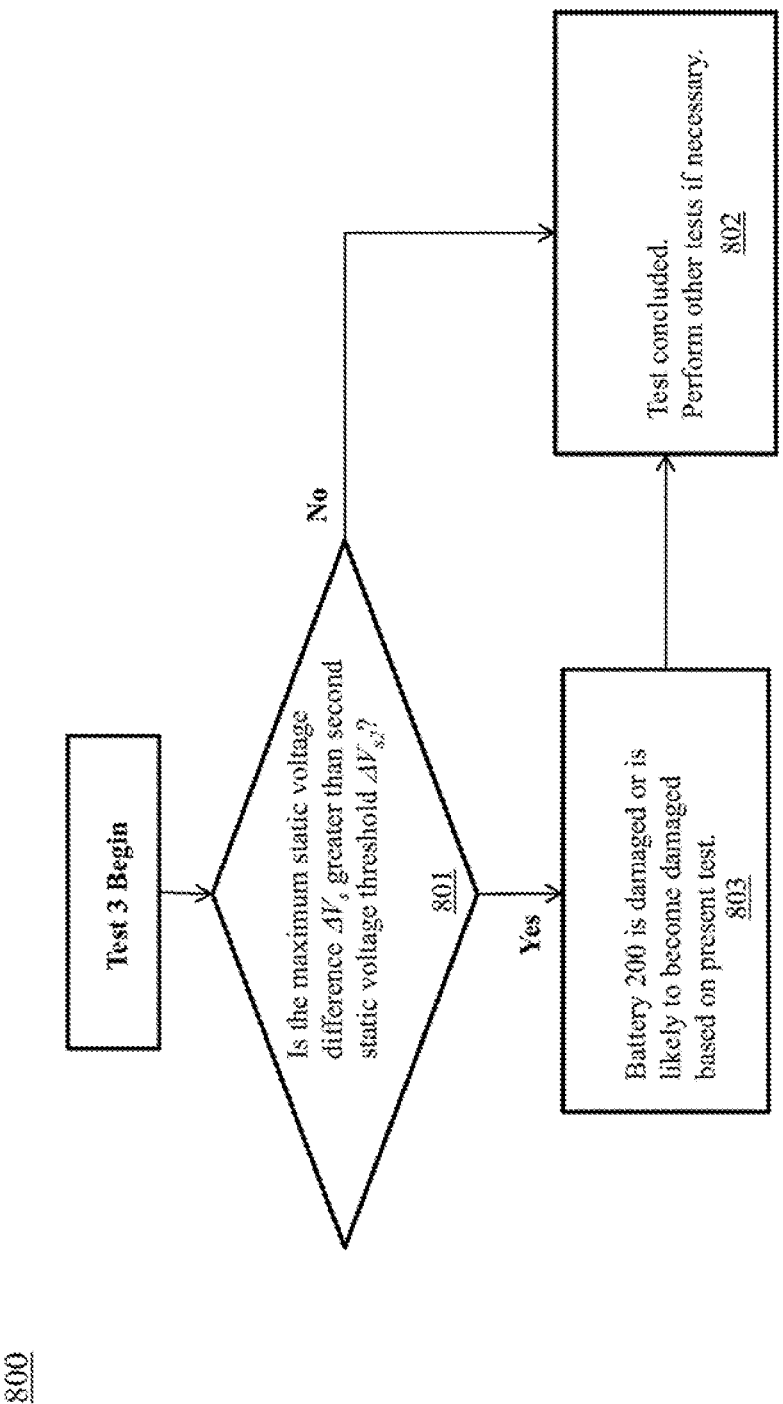
FIG. 8 is an exemplary decision flow chart illustrating still another alternative embodiment of the method of FIG. 4, wherein whether a battery is or is likely to become damaged is determined based on a maximum static voltages difference being greater than a threshold.

Turning now to FIG. 8, yet another exemplary decision flow chart 800 (labeled as "Test 3") is shown for determining whether a battery 200 is damaged or is likely to become damaged based on a maximum static voltage difference $\Delta V_s$, irrespective of the maximum dynamic voltage difference $\Delta V_d$. At 801, whether the maximum static voltage difference $\Delta V_s$ is greater than a second static voltage threshold $\Delta V_{s2}$ is determined. If the maximum static voltage difference $\Delta V_s$ is not greater than the second static voltage threshold $\Delta V_{s2}$, then the present test is concluded at 802, and other optional tests can be performed if necessary. If the maximum static voltage difference $\Delta V_s$ is greater than the second static voltage threshold $\Delta V_{s2}$, then the present test is concluded at 803, and the battery 200 is determined to be damaged or likely to become damaged based on the present test.

Figure 9:
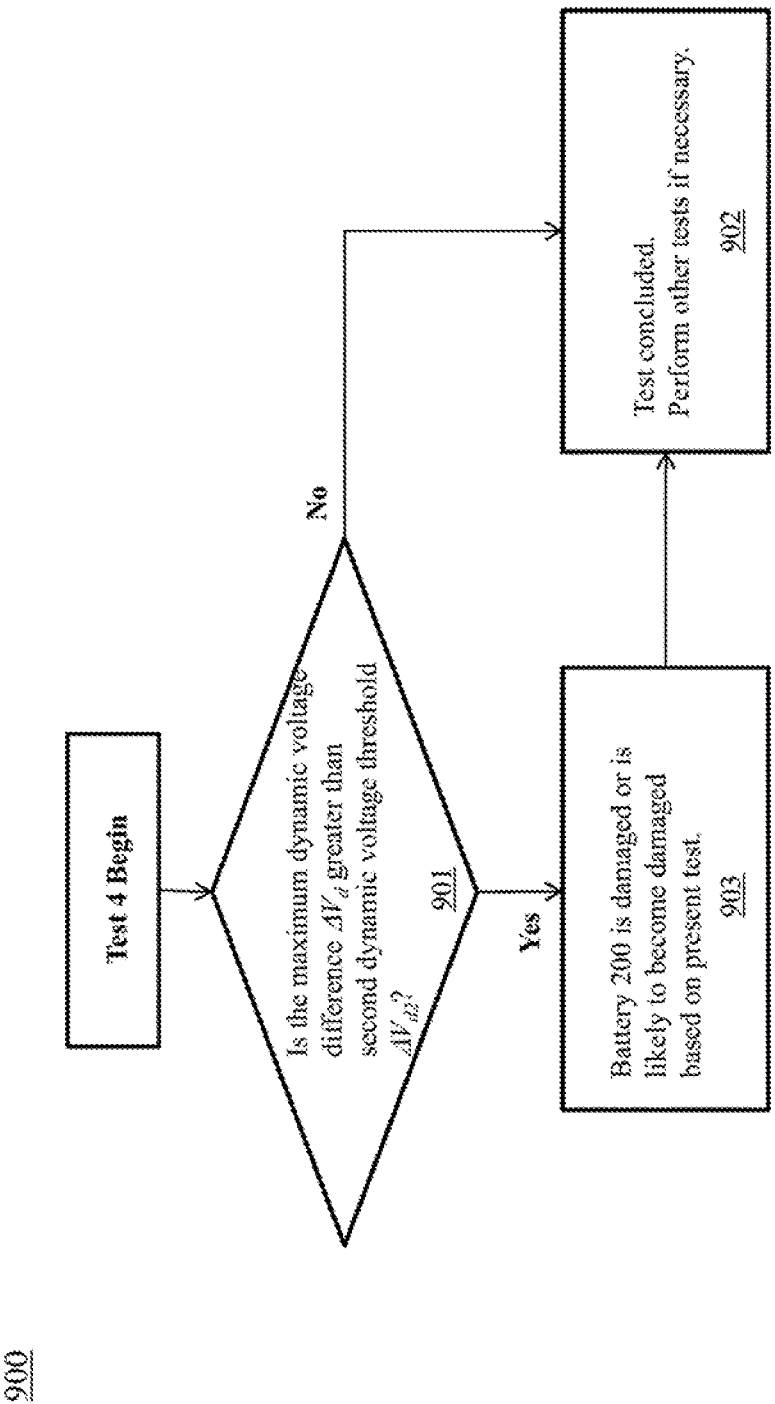
FIG. 9 is an exemplary decision flow chart illustrating yet another alternative embodiment of the method of FIG. 4, wherein whether a battery is or is likely to become damaged is determined based on a maximum dynamic voltages difference being greater than a threshold.

Turning now to FIG. 9, yet another exemplary decision flow chart 900 (labeled as "Test 4") is shown for determining whether a battery 200 is damaged or is likely to become damaged based on a maximum dynamic voltage difference $\Delta V_d$, irrespective of the maximum static voltage difference $\Delta V_s$. At 901, whether the maximum dynamic voltage difference $\Delta V_d$ is greater than a second dynamic voltage threshold $\Delta V_{d2}$ is determined. If the maximum dynamic voltage difference $\Delta V_d$ is not greater than the second dynamic voltage threshold $\Delta V_{d2}$, then the present test is concluded at 902, and other optional tests can be performed if necessary. If the maximum dynamic voltage difference $\Delta V_d$ is greater than the second dynamic voltage threshold $\Delta V_{d2}$, then the present test is concluded at 903, and the battery 200 is determined to be damaged or likely to become damaged based on the present test.

One or more tests as described herein can be used to diagnose damage or potential damage to a battery 200. The tests can be applied in any suitable manner. For example, the tests can be applied conjunctively, where a battery 200 is found to be damaged or likely to become damaged if all of the tests find that the battery 200 is damaged or likely to become damaged. Additionally and/or alternatively, the tests can be applied disjunctively, where a battery 200 is found to be damaged or likely to become damaged if at least one of the tests finds that the battery 200 is damaged or likely to become damaged.

One or more optional additional factors can be considered to determine whether the result of one or more battery damage diagnostic tests is reliable. For example, temperature can effect the reliability of the battery damage diagnostic test results. When an ambient temperature surrounding the battery 200 is too low, the result of battery damage diagnoses may be unreliable. This unreliability can result from different cells 210 of the battery 200 being exposed to the low ambient temperature to different extents from one another. Cells 210 that are physically located toward the exterior of the battery 200 may be exposed to lower temperatures than cells 210 that are physical located toward the interior of the battery 200. Such a differential effect of the low ambient temperature on the cells 210 can increase the voltage differences across the cells 210 and impact the battery damage diagnosis, rendering the diagnosis unreliable.

As another example, toward the end of a discharge process of a battery 200, differences between voltages across the cells 210 may also be artificially large and render the battery damage diagnosis unreliable. The artifacts attributable to battery discharge are usually manifest in low voltage values across the cells 210. Thus, such artifacts can be avoided by screening for low cell voltages and denoting battery damage diagnoses obtained under such conditions as being unreliable. Particular reliability tests for determining the reliability of battery damage diagnoses are described below with reference to FIGS. 10 and 11.

Figure 10:
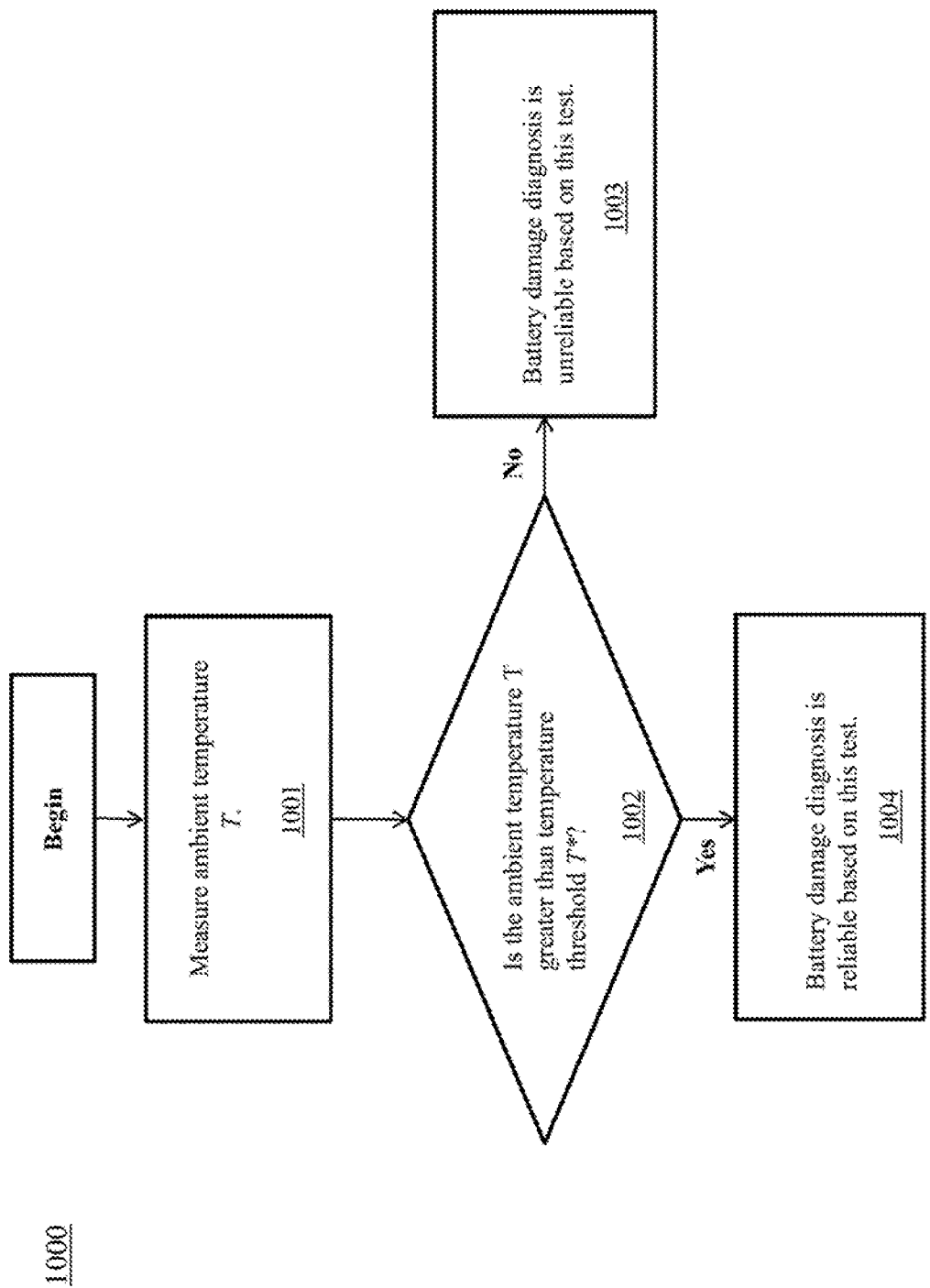
FIG. 10 is an exemplary decision flow chart illustrating an alternative embodiment of the method of FIG. 3, wherein whether a battery damage diagnosis is reliable is determined based on an ambient temperature.

Turning now to FIG. 10, an exemplary decision flow chart 1000 is shown for determining whether a battery damage diagnosis is reliable based on an ambient temperature T. At 1001, the ambient temperature T surrounding the battery 200 (shown in FIG. 2) is measured. The ambient temperature T can be measured, for example, using a thermometer that can be part of the battery diagnostic system 100 (shown in FIG. 1). At 1002, whether the ambient temperature T is greater than a temperature threshold T* is determined. If the ambient temperature T is not greater than the temperature threshold T*, then, at 1003, a battery damage diagnosis is determined to be unreliable based on this temperature test. If the ambient temperature T is greater than the temperature threshold T*, then, at 1004, the battery damage diagnosis is determined to be reliable based on this temperature test.

The temperature threshold T* can vary depending on the battery 200 and/or and application/apparatus powered by the battery 200. Exemplary temperature threshold T* include, but are not limited to, −50 degrees Celsius, −30 degrees Celsius, −20 degrees Celsius, −10 degrees Celsius, −5 degrees Celsius, 0 degrees Celsius, 5 degrees Celsius, 10 degrees Celsius, 15 degrees Celsius, 20 degrees Celsius, or higher. Where the battery 200 is used to power a mobile platform such as a UAV (shown in FIG. 12), an exemplary temperature threshold T* is 5 degrees Celsius.

Figure 11:
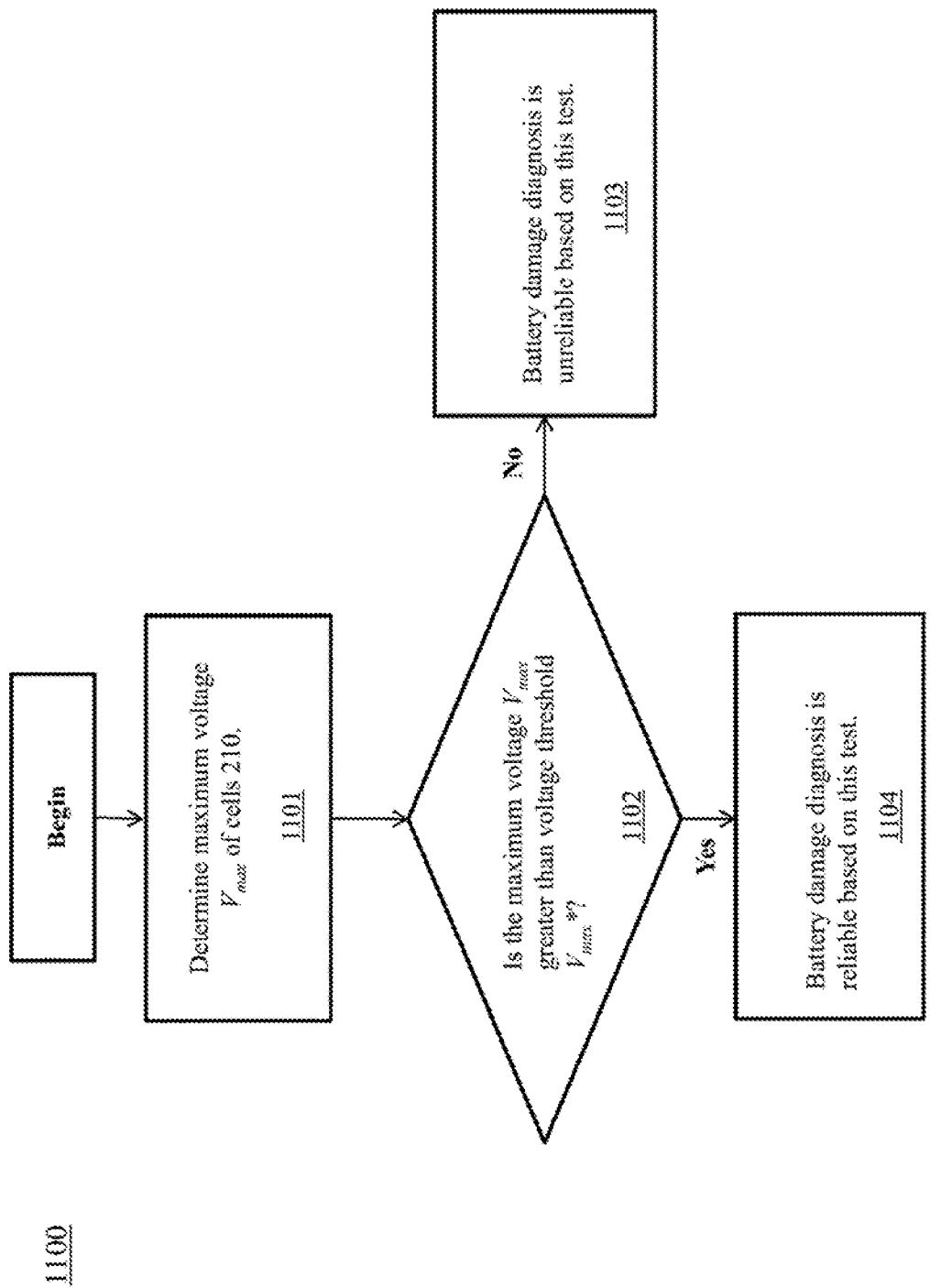
FIG. 11 is an exemplary decision flow chart illustrating another alternative embodiment of the method of FIG. 3, wherein whether a battery damage diagnosis is reliable is determined based on a maximum voltage of a set of battery cells.

Turning now to FIG. 11, an exemplary decision flow chart 1100 is shown for determining whether a battery damage diagnosis is reliable based on a maximum voltage $V_{max}$ of the cells 210 (shown in FIG. 2). At 1101, a maximum voltage $V_{max}$ from among the voltages of the cells 210 is determined. Either static voltages or dynamic voltages of the cells 210 can be used for purposes of determining the maximum voltage $V_{max}$. At 1102, whether the maximum voltage $V_{max}$ is greater than a voltage threshold $V_{max}^*$ is determined. If the maximum voltage $V_{max}$ is not greater than the voltage threshold $V_{max}^*$, then, at 1103, any battery damage diagnosis is determined to be unreliable based on this maximum voltage test. If the maximum voltage $V_{max}$ is greater than the voltage threshold $V_{max}^*$, then, at 1104, the battery damage diagnosis is determined to be reliable based on this maximum voltage test.

The voltage threshold $V_{max}^*$ can vary depending on the battery 200 and/or and application/apparatus powered by the battery 200. Exemplary voltage thresholds $V_{max}^*$ include, but are not limited to, about 2.0 volts, 2.5 volts, 3.0 volts, 3.5 volts, 4.0 volts, 4.5 volts, 5.0 volts, 5.5 volts, 6.0 volts, or higher. Where the battery 200 is used to power a mobile platform such as a UAV (shown in FIG. 12), an exemplary voltage thresholds $V_{max}*$ is 3.65 volts.

One or more of reliability tests described herein can be used to determine, under any particular circumstance, whether a battery damage diagnostic is reliable. In some embodiments, these reliability tests can be applied conjunctively, where the battery damage diagnostic is found to reliable only if all of the reliability tests indicate that the diagnostic is reliable. In other embodiments, the reliability tests can be applied disjunctively, where the battery damage diagnostic is found to reliable if at least one of reliability tests indicates that the diagnostic is reliable. The reliability tests can be performed prior to and/or subsequent to any battery damage diagnostic.

Figure 12:
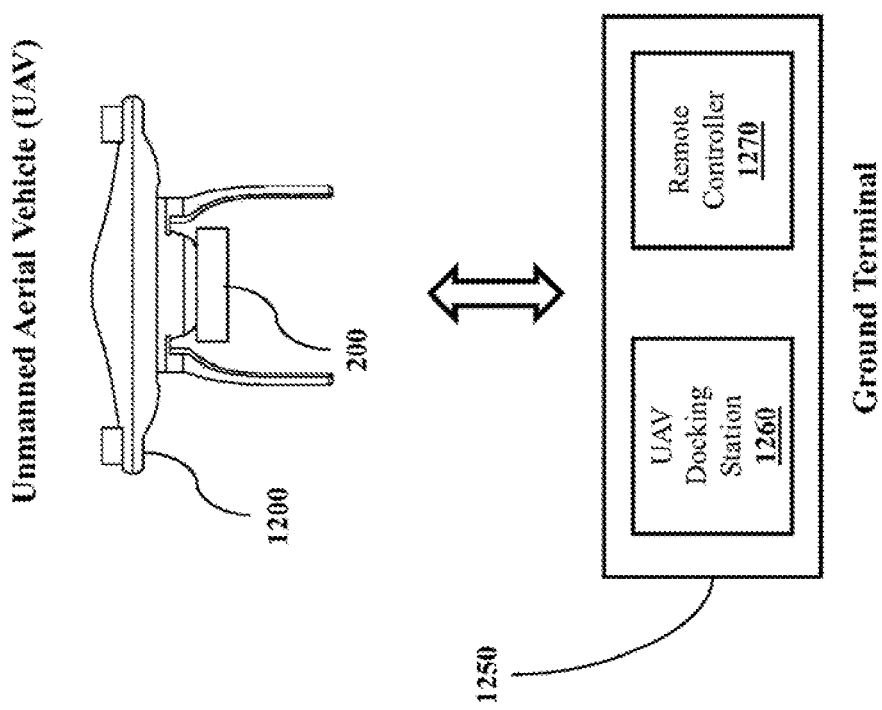
FIG. 12 is an exemplary diagram illustrating a battery mounted aboard an unmanned aerial vehicle (UAV) interacting with a ground terminal.

Turning now to FIG. 12, an exemplary embodiment is shown of a battery 200 associated with a mobile platform. Exemplary mobile platforms include, but are not limited to, bicycles, automobiles, trucks, ships, boats, trains, helicopters, aircraft, various hybrids thereof, and the like. In the embodiment shown in FIG. 12, the mobile platform is an unmanned aerial vehicle (UAV), which is colloquially referred to as a "drone." UAVs are aircraft without a human pilot onboard the vehicle whose flight is controlled autonomously or by a remote pilot (or sometimes both). UAVs are now finding increased usage in civilian applications involving various aerial operations, such as data-gathering or delivery.

The present battery diagnostic systems and methods are suitable for the batteries of many types of UAVs including, without limitation, quadcopters (also referred to a quadrotor helicopters or quad rotors), single rotor, dual rotor, trirotor, hexarotor, and octorotor rotorcraft UAVs, fixed wing UAVs, and hybrid rotorcraft-fixed wing UAVs. In some embodiments, the battery diagnostics described herein can advantageously be performed without removing the battery 200 from the UAV 1200, allowing real-time battery damage diagnoses while the UAV 1200 is in operation. In some embodiments, the battery diagnostics can be performed after the battery 200 is removed from the UAV 1200.

Also shown in FIG. 12 is a ground terminal 1250 that can perform a variety of related functions for the UAV 1200, including control and support functions. The ground terminal 1250 can include a UAV docking station 1260 that can serve as a take-off and/or landing platform for the UAV 1200. The ground terminal 1250 can also include a remote controller 1270 that can be used to remotely control the UAV 1200 through wireless signals sent to, and received from, the UAV 1200.

Figure 13:
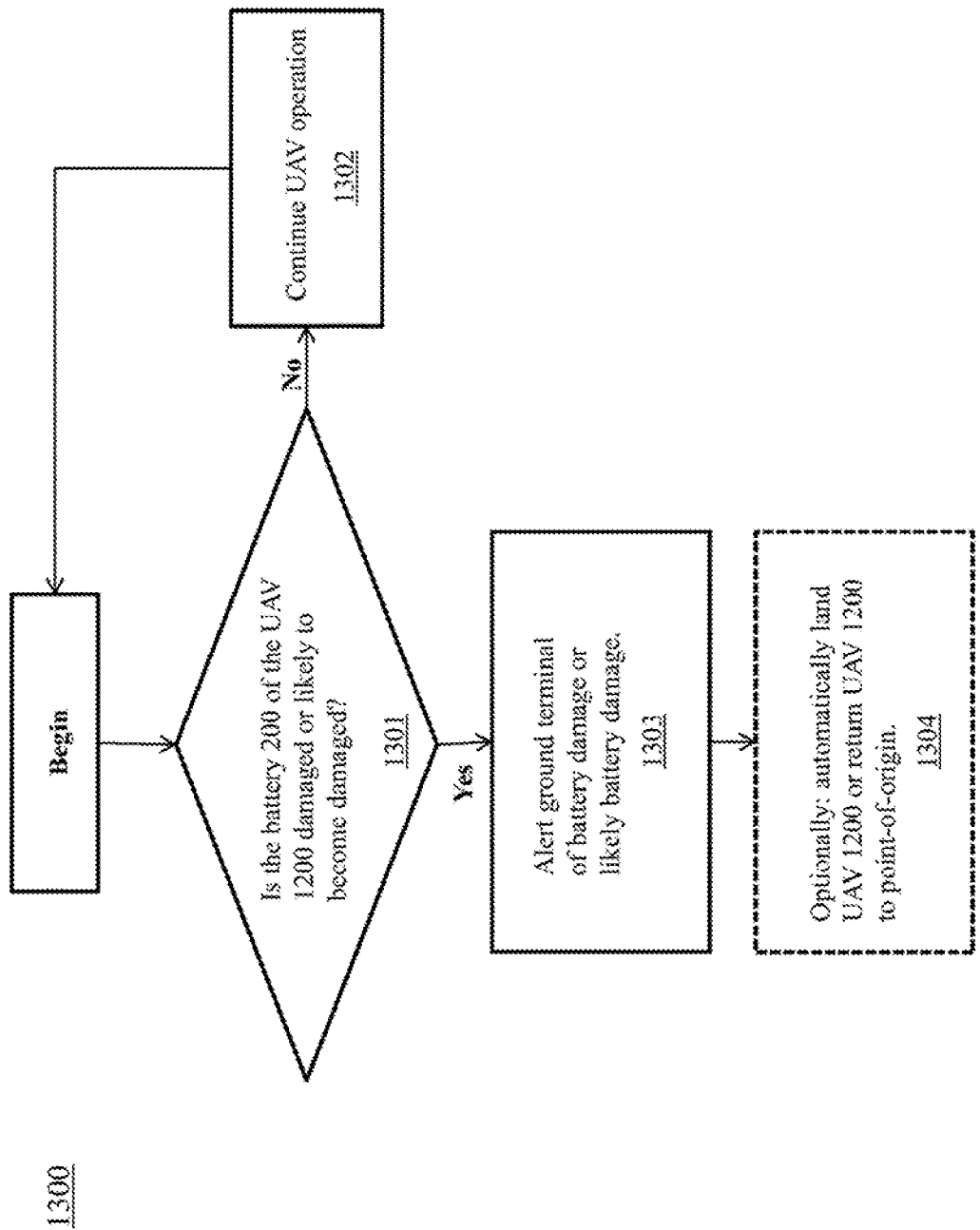
FIG. 13 is an exemplary decision flow chart illustrating yet another alternative embodiment of the method of FIG. 3, wherein the UAV or returning the UAV to a point-of-origin is automatically landed upon finding that the battery is damaged or likely to become damaged.

Turning now to FIG. 13, an exemplary method 1300 is shown for operating a UAV 1200 (shown in FIG. 12) based on battery diagnostics. At 1301, a battery damage diagnosis according to any of the methods described herein is performed on a battery 200 of a UAV 1200 in operation (for example, preparing for take-off or in flight). If the battery 200 is determined to be not damaged and/or not likely to become damaged, then operation of the UAV 1200 is continued, at 1302. If the battery 200 of the UAV 1200 is determined to be damaged and/or likely to become damaged, then a ground terminal 1250 (shown in FIG. 12) can be alerted of such damage or likely damage, at 1303. In certain embodiments, an alert can be sent to a remote controller 1270 (shown in FIG. 12) and/or to a UAV docking station 1260 (shown in FIG. 12), signaling an emergency state of the UAV 1200 in which the battery 200 is damaged or likely to become damaged. This emergency state can trigger a number of responses, either automatically or based on feedback from a user. For example, at 1304, the remote controller can be configured to automatically land the UAV 1200 based on the UAV's present location. Alternatively and/or additionally, the remote controller 1270 and/or the UAV 1200 can be configured to signal the UAV 1200 to return to a point-of-origin for the UAV 1200. The point-of-origin can be the UAV docking station 1260, which can be alerted to the return of the UAV 1200 and prepare for the return accordingly. Alternatively and/or additionally, one or more users can be alerted to the emergency state of the UAV 1200 with appropriate warnings (for example, flashing lights and/or alarm sounds).

The disclosed embodiments are susceptible to various modifications and alternative forms, and specific examples thereof have been shown by way of example in the drawings and are herein described in detail. It should be understood, however, that the disclosed embodiments are not to be limited to the particular forms or methods disclosed, but to the contrary, the disclosed embodiments are to cover all modifications, equivalents, and alternatives.

What is claimed is:

1. A method for detecting an operational status of a battery including a plurality of cells, comprising:
   obtaining a current drawn from the battery;
   in response to the current being less than a first current threshold, measuring static voltages each being a first electrical potential difference across one cell of a subset of the cells;
   in response to the current being greater than a second current threshold, measuring dynamic voltages each being a second electrical potential difference across one cell of the subset of the cells, the second current threshold being determined at least by a configuration of the subset of the cells and a load on the battery;
   obtaining a relation between maximum dynamic voltage differences of the plurality of cells in the battery and maximum static voltage differences of the plurality of cells in the battery based on a type of the battery and the load on the battery, the relation including damage regimes indicative of a damage of the battery;
   for the subset of the cells:
      calculating static voltage differences each between two cells from the subset, and determining a maximum static voltage difference of the subset based on the static voltage differences, and
      calculating dynamic voltage differences each between two cells from the subset, and determining a maximum dynamic voltage difference of the subset based on the dynamic voltage differences; and
   determining the operational status of the battery based on the relation including the damage regimes and at least one of the maximum static voltage difference of the subset or the maximum dynamic voltage difference of the subset.

2. The method of claim 1, wherein:
   the first current threshold is in a range from 2 amperes to 10 amperes; and
   the second current threshold is in a range from 2 amperes to 10 amperes.

3. The method of claim 1, wherein determining the operational status of the battery includes:
   determining the maximum static voltage difference based on all pairs of the static voltages;
   determining the maximum dynamic voltage difference based on all pairs of the dynamic voltages; and determining whether the battery is damaged or is likely to become damaged based on the relation including the damage regions and the at least one of the maximum static voltage difference or the maximum dynamic voltage difference.

4. The method of claim 3, wherein determining whether the battery is damaged or is likely to become damaged includes determining that the battery is damaged or is likely to become damaged in response to one of:
the maximum static voltage difference being less than a first static voltage threshold and the maximum dynamic voltage difference being greater than a first dynamic voltage threshold;
a ratio of the maximum dynamic voltage difference to the maximum static voltage difference being greater than a ratio threshold, and the maximum static voltage difference being between the first static voltage threshold and a second static voltage threshold, the second static voltage threshold being greater than the first static voltage threshold;
the maximum static voltage difference being greater than the second static voltage threshold; or
the maximum dynamic voltage difference being greater than a second dynamic voltage threshold, the second dynamic voltage threshold being greater than the first dynamic voltage threshold.

5. The method of claim 4, wherein:
the first static voltage threshold is in a range from 50 millivolts to 100 millivolts;
the second static voltage threshold is in a range from 100 millivolts to 200 millivolts;
the first dynamic voltage threshold is in a range from 100 millivolts to 200 millivolts;
the second dynamic voltage threshold is in a range from 200 millivolts to 400 millivolts;
or
the ratio threshold is in a range from one to five.

6. The method of claim 1, further comprising:
measuring an ambient temperature; and
determining that a result of determining the operational status is unreliable in response to the ambient temperature being lower than a temperature threshold.

7. The method of claim 6, wherein the temperature threshold is 5 degrees Celsius.

8. The method of claim 1, further comprising:
determining a maximum voltage of the subset of the cells; and
determining that a result of determining the operational status is unreliable in response to the maximum voltage being less than a voltage threshold.

9. The method of claim 8, wherein the voltage threshold is 3.65 volts.

10. The method of claim 1,
wherein the battery is configured to provide power to an unmanned aerial vehicle (UAV);
the method further comprising:
upon determining that the battery is damaged or is likely to become damaged, performing at least one of:
alerting a ground terminal associated with the UAV;
automatically landing the UAV; or
automatically returning the UAV to a point-of-origin.

11. A system for detecting an operational status of a battery including a plurality of cells, comprising:
one or more processors individually or collectively configured to obtain a current drawn from the battery; and
one or more detectors;

wherein:
in response to the current being less than a first current threshold, the one or more detectors are configured to measure static voltages each being a first electrical potential difference across one cell of a subset of the cells;
in response to the current being greater than a second current threshold, the one or more detectors are configured to measure dynamic voltages each being a second electrical potential difference across one cell of the subset of the cells, the second current threshold being determined at least by a configuration of the subset of the cells and a load on the battery; and
the one or more processors are further configured to:
obtain a relation between maximum dynamic voltage differences of the plurality of cells in the battery and maximum static voltage differences of the plurality of cells in the battery based on a type of the battery and the load on the battery, the relation including damage regions indicative of a damage of the battery;
for the subset of the cells:
calculate static voltage differences each between two cells from the subset, and determine a maximum static voltage difference of the subset based on the static voltage differences, and
calculate dynamic voltage differences each between two cells from the subset, and determine a maximum dynamic voltage difference of the subset based on the dynamic voltage differences; and
determine the operational status of the battery based on the relation including the damage regions and at least one of the maximum static voltage difference of the subset or the maximum dynamic voltage difference of the subset.

12. The system of claim 11, wherein at least one of the detectors includes a voltmeter or an energy meter chip.

13. The system of claim 11, wherein the one or more processors are further configured to:
determine the maximum static voltage difference based on all pairs of the static voltages;
determine the maximum dynamic voltage difference based on all pairs of the dynamic voltages; and
determine whether the battery is damaged or is likely to become damaged based on the relation including the damage regions and the at least one of the maximum static voltage difference or the maximum dynamic voltage difference.

14. The system of claim 13, wherein the one or more processors are further configured to determine that the battery is damaged or is likely to become damaged in response to one of:
the maximum static voltage difference being less than a first static voltage threshold and the maximum dynamic voltage difference being greater than a first dynamic voltage threshold;
a ratio of the maximum dynamic voltage difference to the maximum static voltage difference being greater than a ratio threshold, and the maximum static voltage difference being between the first static voltage threshold and a second static voltage threshold, the second static voltage threshold being greater than the first static voltage threshold;
the maximum static voltage difference being greater than the second static voltage threshold; or the maximum dynamic voltage difference being greater than a second dynamic voltage threshold, the second dynamic voltage threshold being greater than the first dynamic voltage threshold.

15. The system of claim 11, further comprising:
a thermometer configured to measure an ambient temperature,
wherein the one or more processors are further configured to determine that a determination result of the operational status is unreliable in response to the ambient temperature being lower than a temperature threshold.

16. The system of claim 11, wherein the one or more processors are further configured to:
determine a maximum voltage of the subset of the cells; and
determine that a determination result of the operational status is unreliable in response to the maximum voltage being less than a voltage threshold.

17. The system of claim 11, wherein the battery is a battery of an unmanned aerial vehicle (UAV).

18. The system of claim 17, wherein the one or more processors are further configured to, upon determining that the battery is damaged or is likely to become damaged:
alert a ground terminal;
automatically land the UAV; or
automatically return the UAV to a point-of-origin.

* * * * *